United States Patent
Matsuura

(10) Patent No.: US 10,818,783 B2
(45) Date of Patent: Oct. 27, 2020

(54) SEMICONDUCTOR DEVICE AND MANUFACTURING METHOD THEREFOR

(71) Applicant: Renesas Electronics Corporation, Tokyo (JP)

(72) Inventor: Hitoshi Matsuura, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 99 days.

(21) Appl. No.: 16/256,635

(22) Filed: Jan. 24, 2019

(65) Prior Publication Data

US 2019/0157439 A1    May 23, 2019

Related U.S. Application Data

(62) Division of application No. 15/298,958, filed on Oct. 20, 2016, now Pat. No. 10,304,949.

(30) Foreign Application Priority Data

Oct. 22, 2015  (JP) ................................ 2015-207889

(51) Int. Cl.
*H01L 29/739* (2006.01)
*H01L 29/423* (2006.01)
(Continued)

(52) U.S. Cl.
CPC ...... *H01L 29/7397* (2013.01); *H01L 29/0619* (2013.01); *H01L 29/0696* (2013.01);
(Continued)

(58) Field of Classification Search
CPC combination set(s) only.
See application file for complete search history.

(56) References Cited

U.S. PATENT DOCUMENTS 9,318,586 B2    4/2016 Lee
2003/0080355 A1    5/2003 Shirai et al.
(Continued)

FOREIGN PATENT DOCUMENTS

JP   2009-032951 A   2/2009
JP   2013-140885 A   7/2013
JP   2015-065420 A   4/2015

OTHER PUBLICATIONS

Japanese Office Action issued in corresponding Japanese Patent Application No. 2015-207889, dated Feb. 26, 2019, with English Translation.

*Primary Examiner* — Mamadou L Diallo
(74) *Attorney, Agent, or Firm* — McDermott Will & Emery LLP

(57) ABSTRACT

A semiconductor device includes a trench-gate IGBT enabling the fine adjustment of a gate capacitance independent from cell performance. In a gate wiring lead-out region, a plurality of trenches is arranged spaced apart from each other in an X direction perpendicular to a Y direction. Each trench has a shape enclosed by a rectangular outer outline and a rectangular inner outline in plan view. A trench gate electrode is provided in each of the trenches so as to be electrically coupled to an extraction electrode. To obtain an adequate breakdown voltage between a collector and an emitter, the trenches are formed in a p-type floating region. An n$^-$-type drift region is formed in a region located inside an inner outline of the trench in plan view, whereby a capacitance formed between the trench gate electrode and the n$^-$-type drift region is used as the reverse transfer capacitance.

7 Claims, 40 Drawing Sheets

(51) Int. Cl.
  *H01L 29/06*   (2006.01)
  *H01L 29/40*   (2006.01)
  *H01L 29/66*   (2006.01)
  *H01L 29/49*   (2006.01)
  *H01L 29/10*   (2006.01)

(52) U.S. Cl.
  CPC ........ *H01L 29/407* (2013.01); *H01L 29/4238* (2013.01); *H01L 29/4916* (2013.01); *H01L 29/6634* (2013.01); *H01L 29/66348* (2013.01); *H01L 29/1095* (2013.01)

(56) References Cited

U.S. PATENT DOCUMENTS

| | | |
|---|---|---|
| 2009/0026535 A1 | 1/2009 | Matsuura et al. |
| 2009/0189181 A1 | 7/2009 | Koyama et al. |
| 2010/0187603 A1 | 7/2010 | Hanaoka |
| 2012/0292662 A1 | 11/2012 | Matsuura et al. |
| 2013/0037853 A1* | 2/2013 | Onozawa ............ H01L 29/0839 257/139 |
| 2013/0175574 A1* | 7/2013 | Matsuura .............. H01L 29/407 257/139 |
| 2013/0328105 A1 | 12/2013 | Matsuura |
| 2014/0084332 A1 | 3/2014 | Lee |
| 2014/0339599 A1* | 11/2014 | Onozawa ............ H01L 29/407 257/139 |
| 2015/0060937 A1* | 3/2015 | Hikasa ................ H01L 29/0692 257/139 |
| 2015/0270385 A1 | 9/2015 | Shimomura |
| 2015/0349103 A1* | 12/2015 | Onozawa ............ H01L 29/0619 257/144 |
| 2016/0111529 A1* | 4/2016 | Hirabayashi ........ H01L 29/0696 257/139 |
| 2016/0284824 A1* | 9/2016 | Nagata .................. H01L 23/535 |
| 2016/0336393 A1* | 11/2016 | Kim .................... H01L 29/4236 |
| 2016/0372585 A1* | 12/2016 | Furukawa ............ H01L 29/407 |
| 2017/0092750 A1* | 3/2017 | Nagata .................. H05K 999/99 |

* cited by examiner

SEMICONDUCTOR DEVICE AND MANUFACTURING METHOD THEREFOR

CROSS-REFERENCE TO RELATED APPLICATIONS

This application is a Divisional of U.S. patent application Ser. No. 15/298,958, filed on Oct. 20, 2016, which claims priority from Japanese Patent Application No. 2015-207889 filed on Oct. 22, 2015 including the specification, drawings and abstract is incorporated herein by reference in its entirety.

BACKGROUND

The present invention relates to semiconductor devices and manufacturing methods therefor, and more particularly, a technique suitable for use in a semiconductor device including a trench-gate insulated gate bipolar transistor (IGBT).

For example, Japanese Unexamined Patent Application Publication No. 2013-140885 (Patent Document 1) discloses an injection enhancement (IE) type trench-gate IGBT in which a cell formation region basically includes a first linear unit cell region with a linear active cell region, a second linear unit cell region with a linear hole collector cell region, and a linear inactive cell region located between these regions.

RELATED ART DOCUMENTS

Patent Document

[Patent Document 1] Japanese Unexamined Patent Application Publication No. 2013-140885

SUMMARY

The trench-gate IGBT has a structure suitable to reduce a reverse transfer capacitance and to decrease an on-resistance while maintaining an injection enhancement (IE) effect. However, if the reverse transfer capacitance becomes too low, a switching waveform in the parallel operation of the IGBTs or a transient waveform in short circuit of a load oscillates, and its oscillation cannot be controlled in some cases. In such a case, the depth of a trench in a cell region can be adjusted to increase the reverse transfer capacitance, but the cell performance sometimes changes or deteriorates. Since the depths of all trenches in the cell region tend to change, it is difficult to finely adjust their values. On the other hand, if the reverse transfer capacitance becomes too high, a switching loss is made worse.

Other problems and new features of the present invention will be clearly understood by the following detailed description of the present specification in connection with the accompanying drawings.

A semiconductor device according to one aspect includes: a semiconductor substrate having a first main surface and a second main surface opposite to the first main surface; a first region provided at a center of the semiconductor substrate in plan view; and a second region provided outside the first region in plan view. The first region includes: a plurality of first trenches extending in a first direction and arranged spaced apart from each other in a second direction perpendicular to the first direction at the first main surface; and a plurality of first trench gate electrodes provided in the respective first trenches via a first insulating film. The second region includes: a plurality of second trenches arranged spaced apart from each other in the second direction, each of the second trenches having a shape enclosed by a rectangular outer outline and a rectangular inner outline in plan view; and a plurality of second trench gate electrodes provided in the respective second trenches via a second insulating film. The second trench gate electrodes are electrically coupled together by an extraction electrode formed over the second trench gate electrodes. Each of the first trenches leads to any one of the second trenches, whereby the second trench gate electrodes are electrically coupled to the first trench gate electrodes. Furthermore, the second region includes: a first semiconductor region of a first conductive type provided in the semiconductor substrate; a second semiconductor region of a second conductive type provided in the semiconductor substrate between the first semiconductor region and the first main surface, the second conductive-type being different from the first conductive-type; and a third semiconductor region of the second conductive type provided in the semiconductor substrate between the first semiconductor region and the second main surface. The second trenches are formed in the second semiconductor region in plan view, and a fourth semiconductor region of the first conductive type is formed in a region located outside each of the second trenches and inside the inner outline of each of the second trenches in plan view, the fourth semiconductor region being adapted to be in contact with the second insulating film and to lead to the first semiconductor region.

Accordingly, one embodiment can achieve the semiconductor device including the trench-gate IGBT that enables the fine adjustment of agate capacitance independent from cell performance.

DETAILED DESCRIPTION

Figure 1:
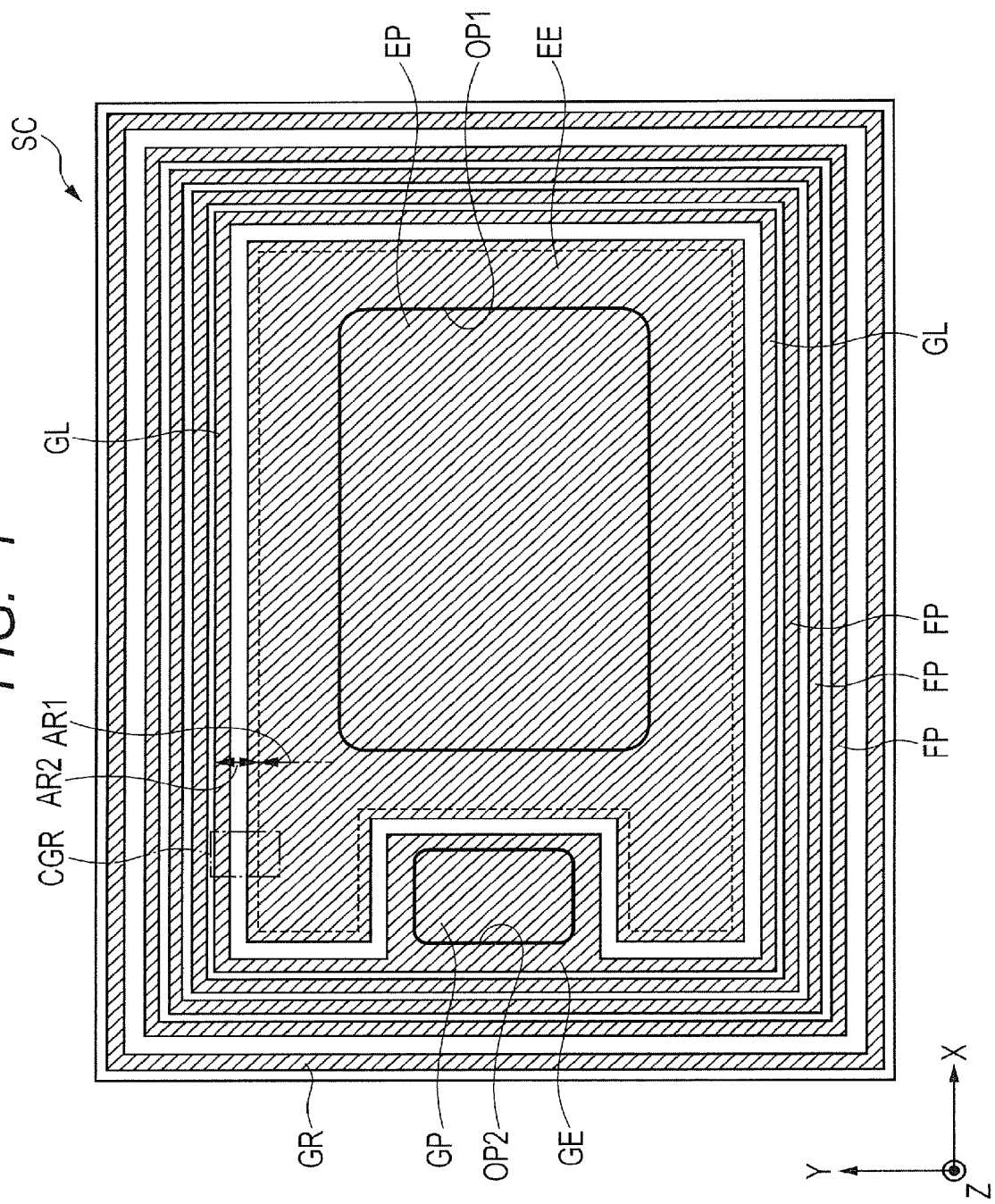
FIG. 1 is a plan view of a semiconductor device (semiconductor chip) according to a first embodiment.

The following preferred embodiments of the invention may be described below by being divided into a plurality of sections or embodiments for convenience, if necessary, which are not independent from each other unless otherwise specified. One of the sections or embodiments may be a modified example, an application example, a detailed description, a supplementary explanation, and the like of apart or all of the other. When referring to a specific number about an element and the like (including the number of elements, a numerical value, an amount, a range, and the like) in the following embodiments, the invention is not limited to the specific number, and may take the number greater than, or less than the specific numeral number, unless otherwise specified, and except when limited to the specific number in principle.

It should be noted that the components (including steps) in the embodiments below are not necessarily essential unless otherwise specified, and except when clearly considered to be essential in principle. Likewise, when referring to the shape of one component, or the positional relationship between the components in the following embodiments, any shape or positional relationship substantially similar or approximate to that described herein may be included in the invention unless otherwise specified and except when clearly considered not to be so in principle. The same goes for the above numbers and the like (including the number of elements, a numerical value, an amount, a range, and the like).

Embodiments will be described in detail below based on the accompanying drawings. In all drawings for explaining the embodiments, parts having the same function are indicated by the same or relevant reference characters, and the repeated description thereof will be omitted. When there is a plurality of similar members (parts), each or specific part is sometimes represented by adding a symbol or number to reference character as a collective term. In the following embodiments, the same or similar parts will not be repeatedly described in principle unless absolutely necessary.

In the accompanying drawings used in the embodiments, even some cross-sectional views may omit hatching for better understanding. Even some plan views may be designated by hatching for easy understanding.

Some cross-sectional views and plan views do not reflect the size of the corresponding part in actual devices and may emphasize a specific part in a relatively large size to make the drawings easily understood. Furthermore, when some cross-sectional views and plan views correspond to each other, a specific part is shown in a relatively large size to make the drawings easily understood.

In the embodiments below, the X direction, Y direction, and Z direction are used as the directions for explanation. The X direction and the Y direction are perpendicular to each other to configure a horizontal surface, while the Z direction is a direction vertical to the horizontal surface.

First Embodiment

A related-art document regarding the disclosure of a trench-gate IGBT is, for example, Japanese Unexamined Patent Application Publication No. 2013-140885 (Patent Document 1). The following features are disclosed in this Japanese Unexamined Patent Application Publication No. 2013-140885 (Patent Document 1), and thus a repeated description thereof will not be given below in principle: (1) the detailed planar structure of a cell formation region; (2) a narrow active cell-type unit cell, and an alternate arrangement system of unit cells; and (3) an active cell two-dimensional thinned-out structure.

Structure of Semiconductor Device

Figure 2:
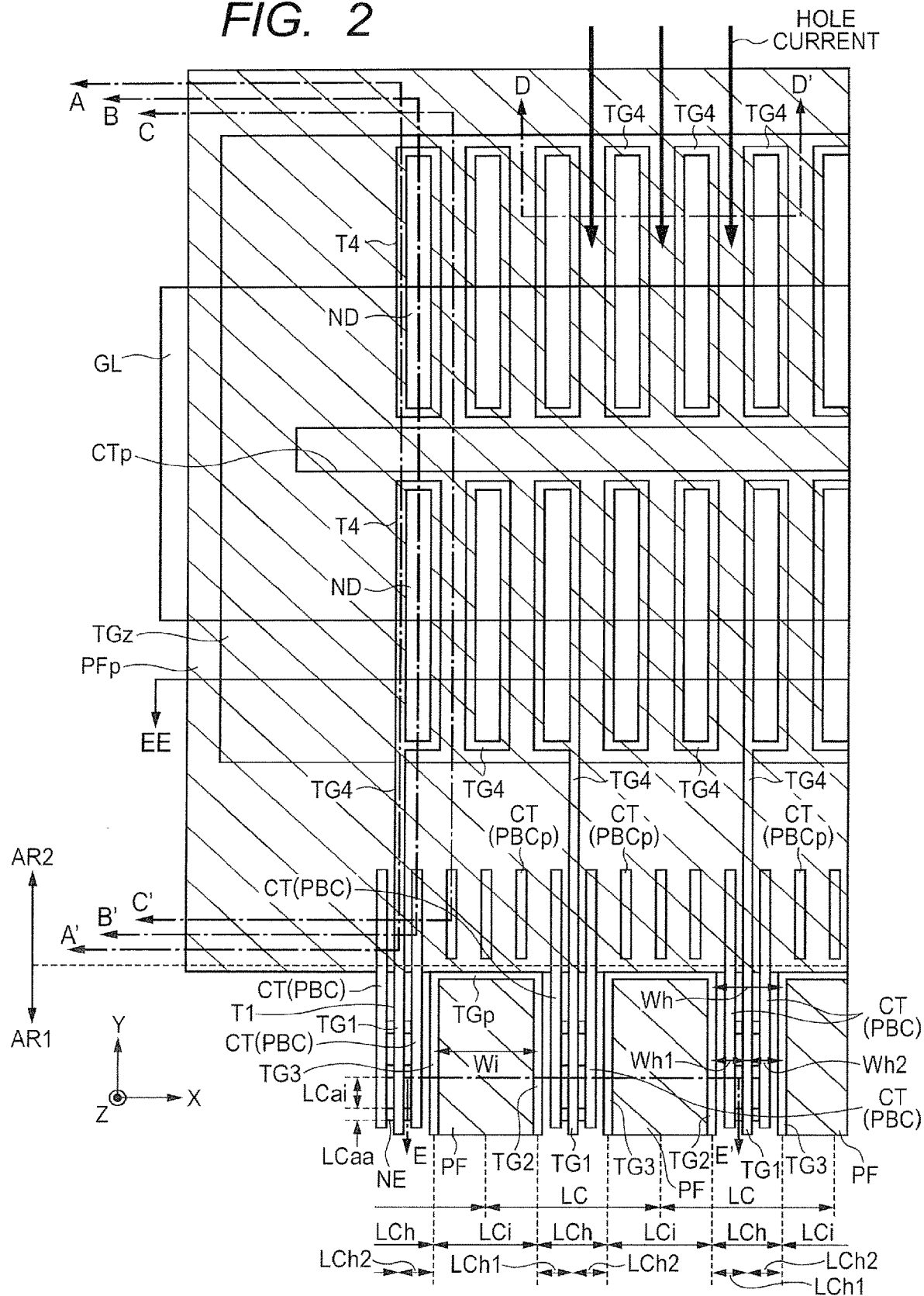
FIG. 2 is a partially enlarged plan view of a cell formation region and a gate wiring lead-out region in the semiconductor device according to the first embodiment, corresponding to a CGR region enclosed by an alternate long and short dash line shown in FIG. 1.
Figure 3:
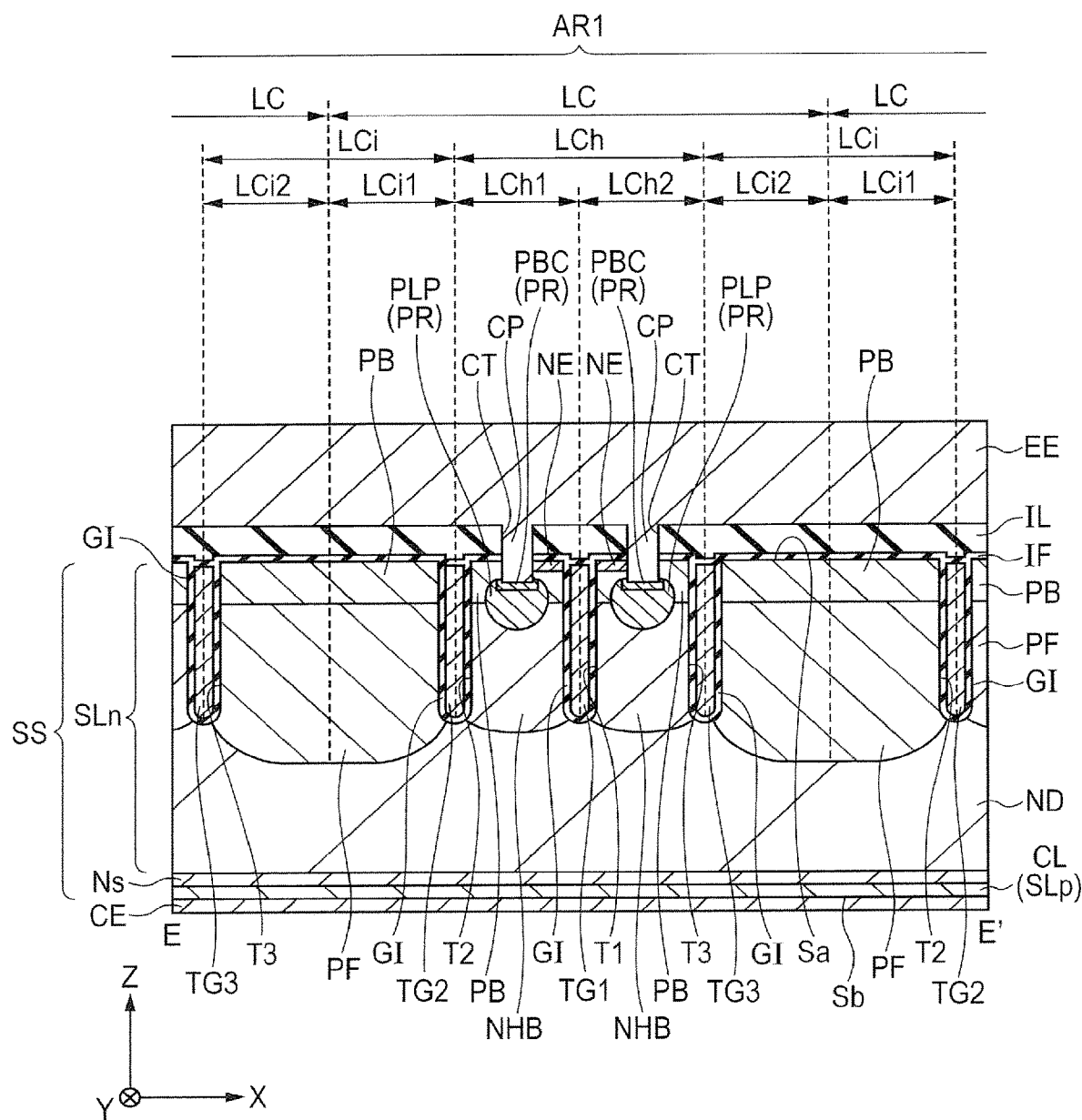
FIG. 3 is a cross-sectional view taken along the line E-E' of FIG. 2.
Figure 4:
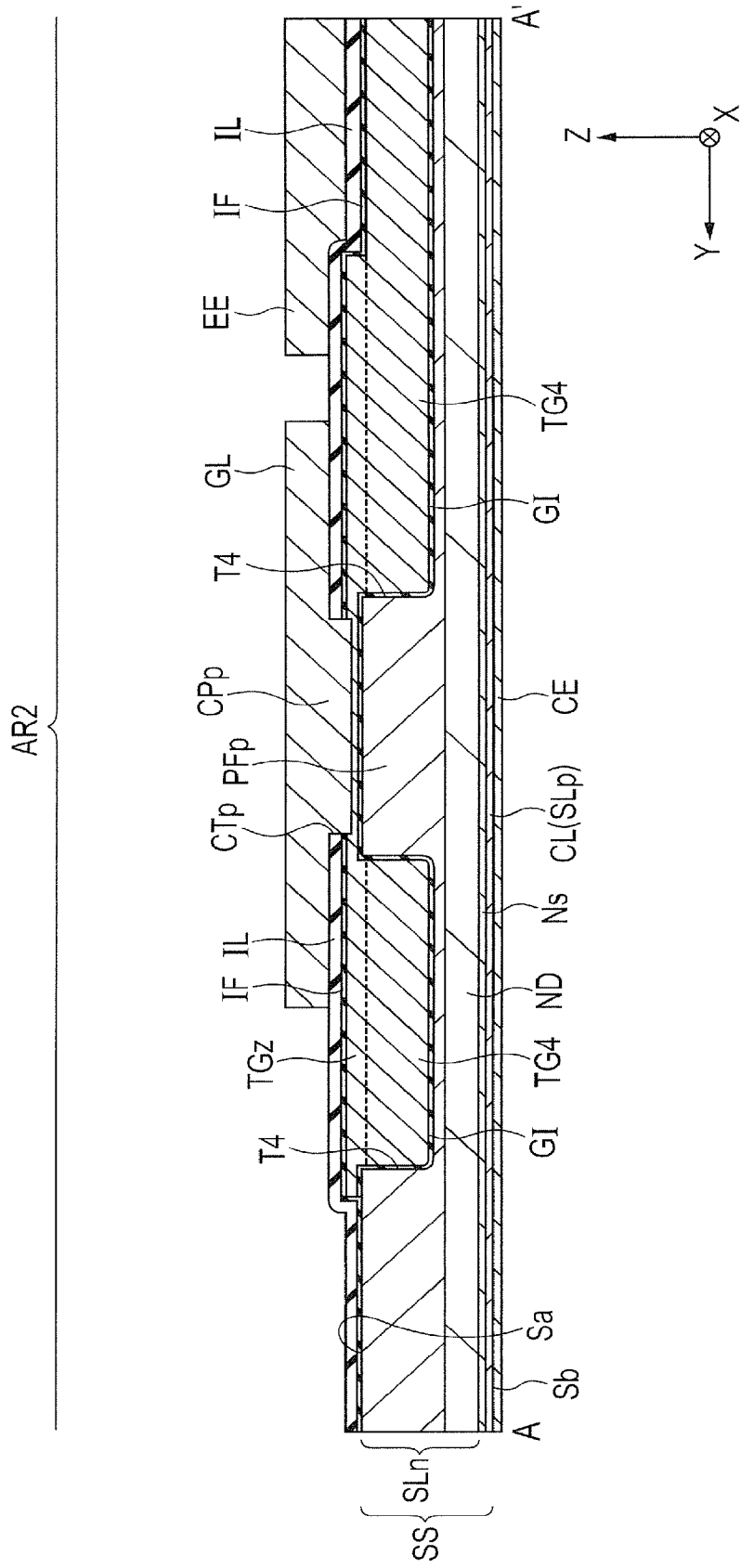
FIG. 4 is a cross-sectional view taken along the line A-A' of FIG. 2.
Figure 5:
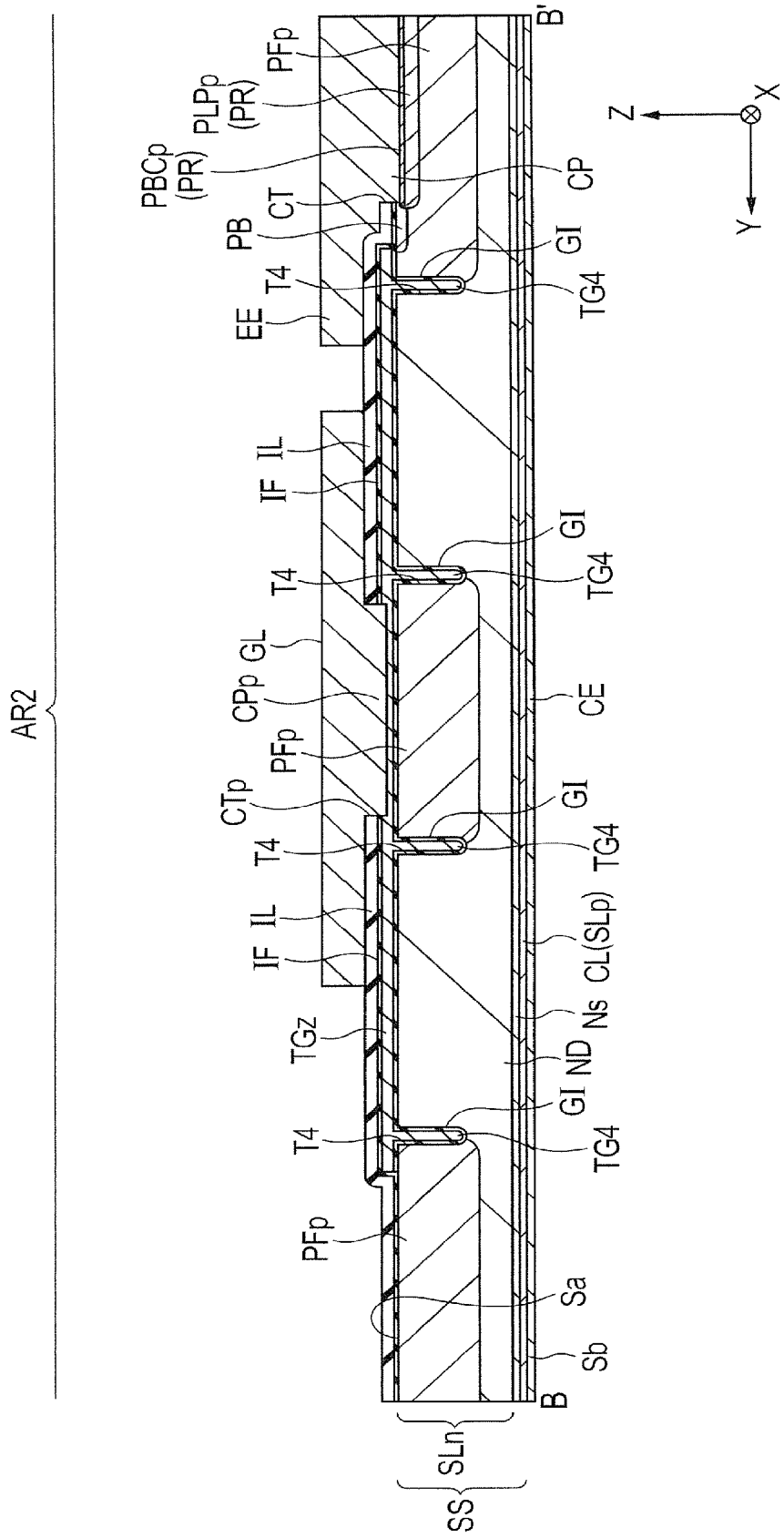
FIG. 5 is a cross-sectional view taken along the line B-B' of FIG. 2.
Figure 6:
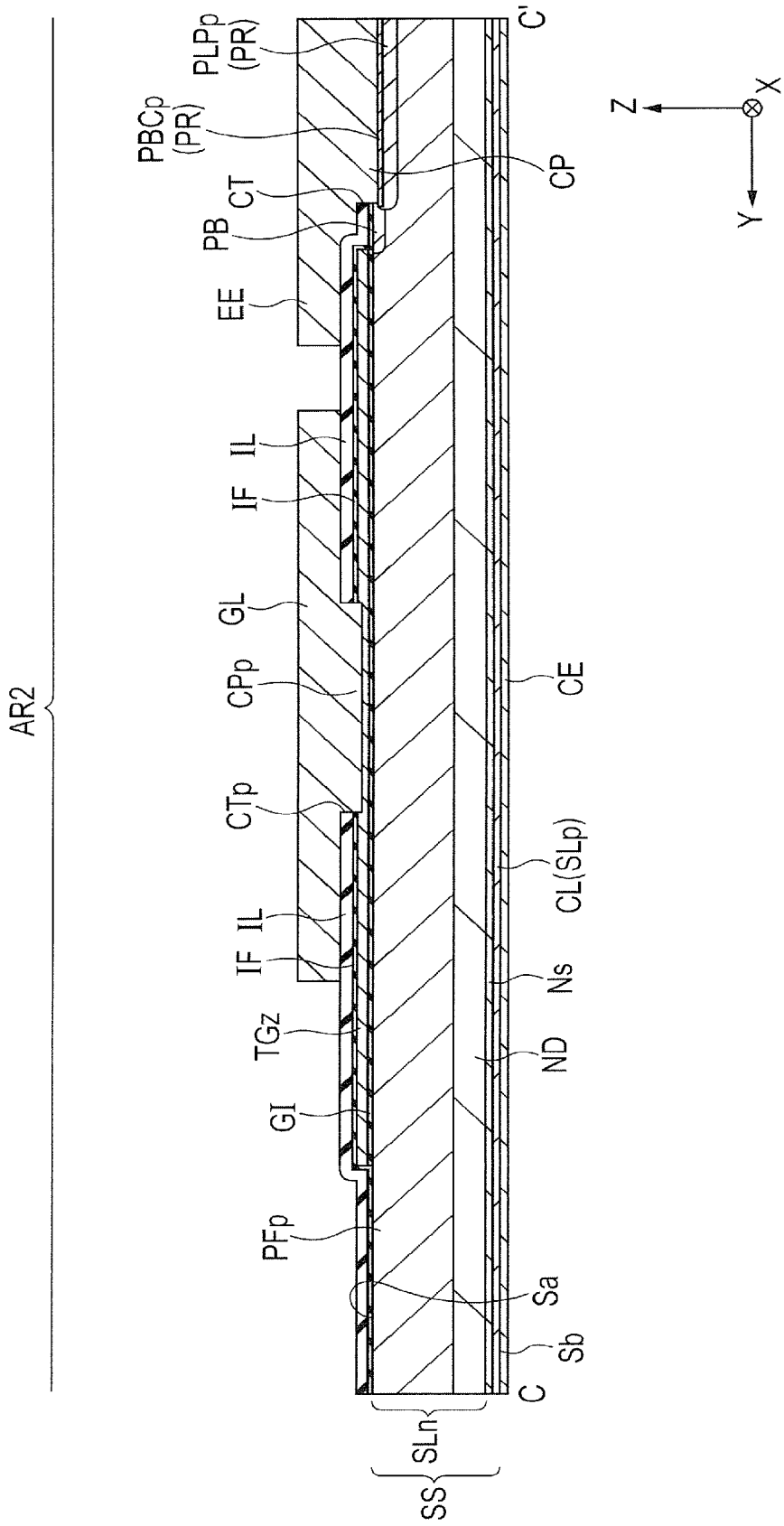
FIG. 6 is a cross-sectional view taken along the line C-C' of FIG. 2.
Figure 7:
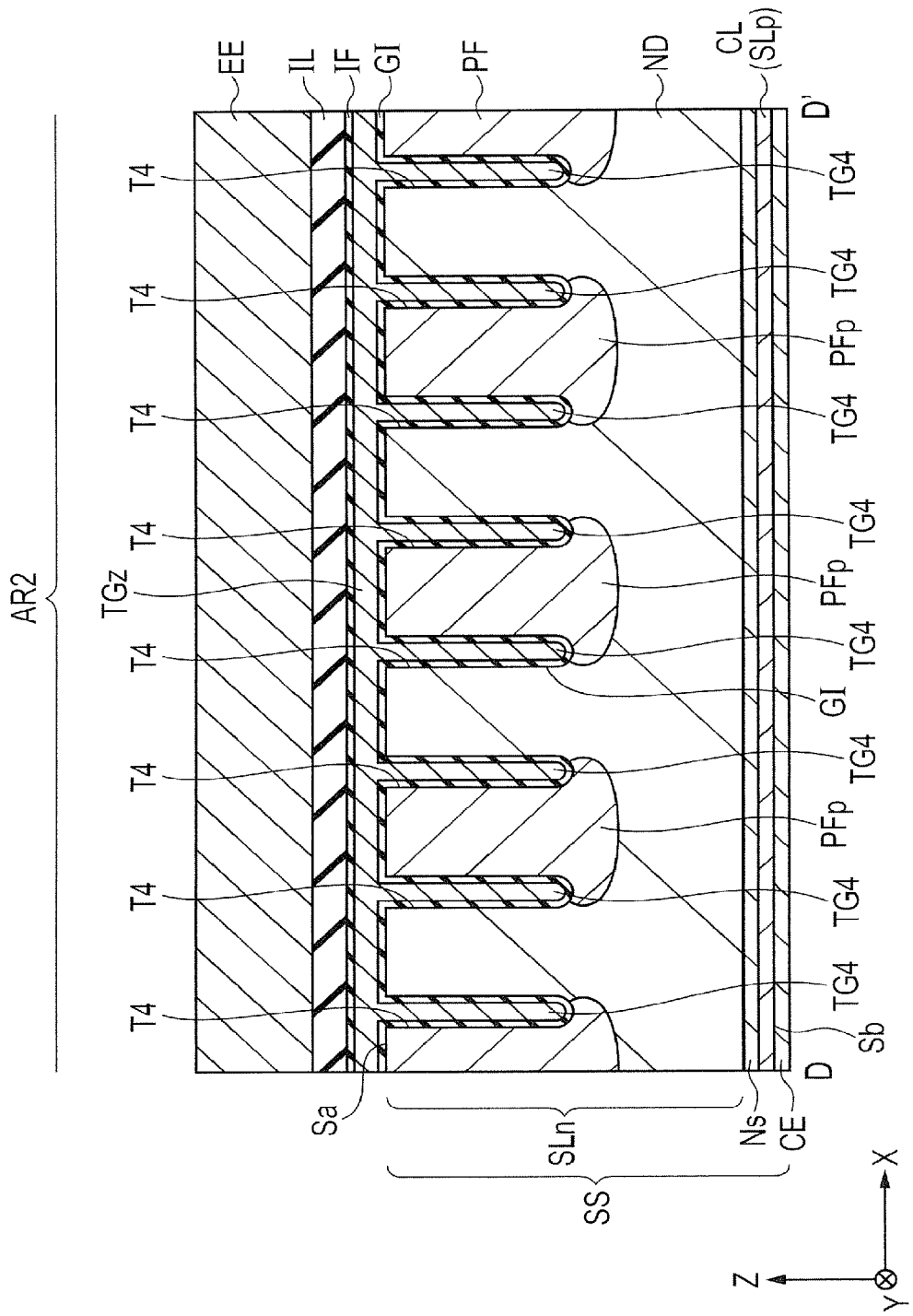
FIG. 7 is a cross-sectional view taken along the line D-D' of FIG. 2.

The structure of a semiconductor device including a trench-gate IGBT in the first embodiment will be described below with reference to FIGS. 1 to 7. FIG. 1 is a plan view of the semiconductor device (semiconductor chip) in the first embodiment. FIG. 2 is a partially enlarged plan view of a cell formation region and a gate wiring lead-out region in the semiconductor device according to the first embodiment, corresponding to a CGR region enclosed by an alternate long and short dash line shown in FIG. 1. FIG. 3 is a cross-sectional view of the cell formation region in the first embodiment, corresponding to the cross-sectional view taken along the line E-E' of FIG. 2. FIGS. 4 to 7 are cross-sectional views of the gate wiring lead-out region in the first embodiment, in which FIG. 4 is a cross-sectional view taken along the line A-A' of FIG. 2, FIG. 5 is a cross-sectional view taken along the line B-B' of FIG. 2, FIG. 6 is a cross-sectional view taken along the line C-C' of FIG. 2, and FIG. 7 is a cross-sectional view taken along the line D-D' of FIG. 2.

The trench-gate IGBT described herein is a so-called emitter-gate-emitter (EGE) trench-gate IGBT that includes three trench gate electrodes arranged spaced apart from each other. One of the trench gate electrodes disposed at the center is electrically coupled to a gate electrode, while the other two disposed at both ends are electrically coupled to respective emitter electrodes.

As shown in FIG. 1, a ring-shaped guard ring GR is provided at an upper surface of an outer region of a semiconductor chip SC. Within the ring, several (a singular or plural) ring-shaped field plates FP are provided to be coupled to ring-shaped floating field ring(s) and the like. The guard ring GR and field plates FP are made of a metal film that contains, for example, aluminum (Al) as a principal component.

A cell formation region AR1 is provided within the ring-shaped field plate FP and in a main part of an active portion of the semiconductor chip SC. An emitter electrode EE is provided at the upper surface of the active portion of the semiconductor chip SC to extend to the vicinity of the outer region of the semiconductor chip SC. The emitter electrode EE is made of a metal film that contains, for example, aluminum (Al) as a principal component. An emitter pad EP for coupling a bonding wire and the like is located at the center of the emitter electrode EE.

A gate wiring lead-out region AR2 is provided between the cell formation region AR1 and the field plate FP. In the gate wiring lead-out region AR2, a gate wiring GL is disposed and coupled to the gate electrode GE. The gate wiring GL and gate electrode GE are made of a metal film that contains, for example, aluminum (Al) as a principal component. A gate pad GP for coupling a bonding wire and the like is located at the center of the gate electrode GE.

First, the structure of the cell formation region AR1 will be described with reference to FIGS. 2 and 3.

A semiconductor substrate SS has an upper surface (main surface) Sa and a lower surface (main surface) Sb opposite to the upper surface Sa. The semiconductor substrate SS includes an n-type semiconductor layer SLn on the upper surface Sa side, and a p-type semiconductor layer SLp on the lower surface Sb side.

An $n^-$-type drift region (n-type semiconductor region) ND is formed in a lower-layer portion of the semiconductor layer SLn. An n-type field stop region (n-type semiconductor region) Ns is formed between the semiconductor layer SLn and the semiconductor layer SLp. The semiconductor layer SLp corresponds to a $p^+$-type collector region (p-type semiconductor region) CL. A collector electrode CE is formed at the lower surface Sb of the semiconductor substrate SS (under $p^+$-type collector region CL).

A p-type body region PB is formed in an upper-layer portion of the semiconductor layer SLn. At the center shown in FIG. 3, a trench (groove, groove portion) T1 is formed at the upper surface Sa side of the semiconductor substrate SS. The trench T1 is formed to reach the midway point of the semiconductor layer SLn while passing through the p-type body region PB from its upper surface Sa. Furthermore, the trench T1 is formed to reach an $n^-$-type drift region ND. The shape of the trench T1 as viewed from its upper surface (hereinafter referred to as a planar shape) is rectangular (linear) with a long side directed in the Y direction. In this way, the trench T1 extends in the Y direction.

A gate insulating film GI is formed at the inner wall of the trench T1. Within the trench T1, a trench gate electrode TG1 is formed over the gate insulating film GI to fill the trench T1 therewith. The trench gate electrode TG1 is electrically coupled to the gate wiring GL and the gate electrode GE (see FIG. 1). Note that the trench gate electrode TG1 in the cell formation region AR1 is continuously formed in the Y direction in plan view.

On the other hand, trenches (grooves, groove portions) T2 and T3 are formed spaced apart from corresponding side of the trench T1 by a predetermined distance (Wh1, Wh2).

Here, a region ranging from the trench T2 to the trench T3 is hereinafter referred to as a hybrid cell region LCh. In this region, a region from the trench T2 to the trench T1 is referred to as a hybrid sub-cell region LCh1, and a region from the trench T3 to the trench T1 is referred to as a hybrid sub-cell region LCh2. Thus, the trench T1 is positioned at a central portion of the hybrid cell region LCh, or at the boundary between the hybrid sub-cell region LCh1 and the hybrid sub-cell region LCh2. Wh1 is a width in the X direction of the hybrid sub-cell region LCh1, and Wh2 is a width in the X direction of the hybrid sub-cell region LCh2.

Inactive cell regions LCi are positioned on both sides of the hybrid cell region LCh. That is, a plurality of hybrid cell regions LCh is disposed with the inactive cell region LCi positioned between the adjacent hybrid cell regions LCh. Note that these regions extend in the Y direction.

In this way, the hybrid cell regions LCh are repeatedly arranged via the inactive cell regions LCi, so that, for example, as shown in FIG. 2, the trench T3 is disposed on the right side of the hybrid cell region LCh while being spaced from the hybrid cell region LCh by the width (Wi) of the interactive cell region LCi. Furthermore, the trench T2 is disposed on the left side of the hybrid cell region LCh while being spaced from the hybrid cell region LCh by the width (Wi) of the interactive cell region LCi.

Here, the unit cell region LC is defined as a region including the hybrid cell region LCh, a part LCi1 of the inactive cell region LCi positioned on one side of the hybrid cell region LCh (on the left side shown in FIG. 3), and a part LCi2 of the inactive cell region LCi position on the other side of the hybrid cell region LCh (on the right side shown in FIG. 3). The part LCi1 is a half part of the inactive cell region LCi on the trench T2 side. The part LCi2 is the other half part of the inactive cell region LCi on the trench T3 side. Thus, the unit cell region LC is repeatedly arranged in the X direction. Here, the width Wh of the hybrid cell region LCh is preferably set narrower than the width Wi of the inactive cell region LCi. In other words, the width of each of the hybrid sub-cell regions LCh1 and LCh2 is more preferably set smaller than half the width Wi of the inactive cell region LCi. In other words, the width of the hybrid sub-cell regions LCh1 and LCh2 is more preferably set smaller than the width of the parts LCi1 and LCi2 of the inactive cell region LCi.

The trenches T2 and T3 respectively extend from the upper surface Sa to reach the midway point of the semiconductor layer SLn, are disposed on both sides of the trench T1 with the trench T1 sandwiched therebetween, and further extend in the Y direction in plan view.

The gate insulating film GI is formed at the inner walls of the trenches T2 and T3. Within the trench T2, a trench gate electrode TG2 is formed over the gate insulating film GI to fill the trench T2 therewith. Within the trench T3, a trench gate electrode TG3 is formed over the gate insulating film GI to fill the trench T3 therewith. The trench gate electrodes TG2 and TG3 are electrically coupled to the emitter electrode EE. Note that each of the trench gate electrodes TG2 and TG3 is continuously formed in the Y direction in plan view.

In the hybrid sub-cell region LCh1, the p-type body region PB is formed between the trenches T1 and T2, and is in contact with the gate insulating film GI formed at the inner wall of the trench T1 as well as the gate insulating film GI formed at the inner wall of the trench T2. In the hybrid sub-cell region LCh2, the p-type body region PB is formed between the trenches T1 and T3, and is in contact with the gate insulating film GI formed at the inner wall of the trench T1 as well as the gate insulating film GI formed at the inner wall of the trench T3.

In each of the hybrid sub-cell regions LCh1 and LCh2, $n^+$-type emitter regions NE are formed only on the side of the trench gate electrode TG1 at the upper surface Sa side of the semiconductor substrate SS. That is, in the hybrid sub-cell region LCh1, the $n^+$-type emitter region NE is not formed on the side of the trench gate electrode TG2, and in the hybrid sub-cell region LCh2, the $n^+$-type emitter region NE is not formed on the side of the trench gate electrode TG3.

Further, a plurality of the $n^+$-type emitter regions NE is disposed in the Y direction at predetermined intervals (LCai). Thus, in the hybrid sub-cell regions LCh1 and LCh2, there are some regions (cross-sections) where the $n^+$-type emitter region NE is not formed therein.

In the hybrid sub-cell region LCh1, the $n^+$-type emitter region NE is formed between the trench T1 and a contact trench CT, and is in contact with the p-type body region PB and the gate insulating film GI (the side surface of the trench T1) formed at the inner wall of the trench T1. In the hybrid sub-cell region LCh2, the $n^+$-type emitter region NE is formed between the trench T1 and a contact trench CT, and is in contact with the p-type body region PB and the gate insulating film GI (the side surface of the trench T1) formed at the inner wall of the trench T1. The planar shape of the $n^+$-type emitter region NE is, for example, rectangular, while its width in the Y direction is LCaa, and its width in the X direction corresponds to a distance between the contact trench CT and the trench T1.

The $n^+$-type emitter region NE in the hybrid sub-cell region LCh1 is electrically coupled to the emitter electrode EE, and the $n^+$-type emitter region NE in the hybrid sub-cell region LCh2 is electrically coupled to the emitter electrode EE.

Preferably, in each of the hybrid sub-cell regions LCh1 and LCh2, an n-type hole barrier region (n-type semiconductor region) NHB is formed under the p-type body region PB. In each of the hybrid sub-cell regions LCh1 and LCh2, the concentration of n-type impurities in the n-type hole barrier region NHB is higher than that of n-type impurities in the $n^-$-type drift region ND, and lower than that of n-type impurities of the $n^+$-type emitter region NE.

The n-type hole barrier region NHB in the hybrid sub-cell region LCh1 is formed between the trenches T1 and T2, while the n-type hole barrier region NHB in the hybrid sub-cell region LCh2 is formed between the trenches T1 and T3.

Note that the n-type hole barrier region NHB in the hybrid sub-cell region LCh1 may be in contact with the p-type body region PB, the gate insulating film GI formed at the inner wall of the trench T1, and the gate insulating film GI formed at the inner wall of the trench T2. The n-type hole barrier region NHB in the hybrid sub-cell region LCh2 may be in contact with the p-type body region PB, the gate insulating film GI formed at the inner wall of the trench T1, and the gate insulating film GI formed at the inner wall of the trench T3. Thus, holes stored in the $n^-$-type drift region ND are less likely to be discharged into the emitter electrodes EE in the hybrid sub-cell regions LCh1 and LCh2, thereby enabling the improvement of the IE effect.

In the inactive cell region LCi on the trench T2 side (on the left side shown in FIG. 3) of the hybrid cell region LCh, a p-type floating region (p-type semiconductor region) PF is provided under the p-type body region PB on the upper surface Sa side of the semiconductor substrate SS. The p-type floating region (a region hatched in the cell formation region AR1 shown in FIG. 2) PF is provided between the above-mentioned trench T2 and a trench T3 located on the left end as shown in FIG. 3. Within the trench T3 on the left end shown in FIG. 3, a trench gate electrode TG3 is formed over the gate insulating film GI to fill the trench T3 therewith. Note that the trench gate electrode TG3 is continuously formed in the Y direction in plan view.

In the inactive cell region LCi on the trench T3 side (on the right side shown in FIG. 3) of the hybrid cell region LCh, a p-type floating region (p-type semiconductor region) PF is provided under the p-type body region PB at the upper surface Sa side of the semiconductor substrate SS. The p-type floating region (a region hatched in the cell formation region AR1 shown in FIG. 2) PF is provided between the above-mentioned trench T3 and a trench T2 located on the right end as shown in FIG. 3. Within the trench T2 on the right end shown in FIG. 3, a trench gate electrode TG2 is formed over the gate insulating film GI to fill the trench T2 therewith. Note that the trench gate electrode TG2 is continuously formed in the Y direction in plan view.

On both sides of the inactive cell region LCi, the trench gate electrodes TG2 and TG3 extending in the Y direction are electrically coupled together by an end trench gate electrode TGp extending in the X direction.

In the hybrid cell region LCh and inactive cell region LCi, an interlayer insulating film IL is formed over the upper surface Sa of the semiconductor substrate SS. The interlayer insulating film IL is formed to cover the p-type body region PB in each of the hybrid sub-cell regions LCh1 and LCh2. Note that an insulating film IF is formed between the upper surface Sa of the semiconductor substrate SS and the interlayer insulating film IL.

Contact trenches (openings) CT are formed in the interlayer insulating film IL. The contact trenches CT are formed in contact with the $n^+$-type emitter regions NE.

A $p^+$-type body contact region (p-type semiconductor region) PBC is formed at the bottom surface of each contact trench CT. A $p^+$-type latch-up prevention region (p-type semiconductor region) PLP is formed under the $p^+$-type body contact region PBC. The $p^+$-type body contact region PBC and the $p^+$-type latch-up prevention region PLP form the $p^+$-type semiconductor region PR.

The p-type impurity concentration in the $p^+$-type body contact region PBC is higher than that in the $p^+$-type latch-up prevention region PLP. The p-type impurity concentration in a $p^+$-type semiconductor region PR is higher than that in the p-type body region PB.

A connection electrode CP is formed inside the contact trench CT. The connection electrode CP is in contact with the $n^+$-type emitter region NE and the $p^+$-type semiconductor region PR.

The emitter electrode EE is formed of a conductive film over the interlayer insulating film IL. The emitter electrode EE is coupled to the $n^+$-type emitter region NE and the $p^+$-type body contact region PBC via the contact trench CT. In the first embodiment, the connection electrode CP and the emitter electrode EE are integrally formed.

Although not shown, an insulating film (passivation film) is formed of, for example, a polyimide-based organic insulating film or the like, over the emitter electrode EE. An emitter wire to be described later is coupled to part of the emitter electrode EE (emitter pad EP (see FIG. 1)) in a region where the insulating film is not formed therein.

Next, the structure of the gate wiring lead-out region AR2 will be described with reference to FIGS. 2 and 4 to 7.

The gate wiring lead-out region AR2 has a portion in which a p-type region (p-type semiconductor region) PFp is provided to surround the periphery of the cell formation region AR1 in plan view. The p-type region (region hatched in the gate wiring lead-out region AR2 in FIG. 2) PFp is electrically coupled to the emitter electrode EE via a $p^+$-type body contact region (p-type semiconductor region) PBCp and a $p^+$-type latch-up prevention region (p-type semiconductor region) PLPp, which are exposed from the bottom of the contact trench CT. The p-type region PFp is at an emitter potential, thereby making it possible to maintain a breakage voltage between the collector and emitter.

Within the gate wiring lead-out region AR2, there is a plurality of trenches T4, each trench being enclosed by a rectangular outer outline and a rectangular inner outline in plan view. In other words, the trench T4 is comprised of a first trench part extending in the Y direction, a second trench part opposed to the first trench part and extending in the Y direction, a third trench part extending in the X direction and coupling one end of the first trench part in the Y direction to one end of the second trench part in the Y direction, and a fourth trench part extending in the X direction and coupling the other end of the first trench part in the Y direction to the other end of the second trench part in the Y direction. The trenches T4 are formed to be spaced apart from each other and have their depth reaching the $n^-$-type drift region ND. The trenches T4 can be formed at the same time as the trenches T1, T2, and T3 formed in the cell formation region AR1.

The p-type region PFp is formed outside the trenches T4 and between the adjacent trenches T4 and T4. The $n^-$-type drift region ND is formed under the p-type region PFp. In contrast, no p-type region PFp is formed, and the $n^-$-drift region ND is formed in a region located outside the trench T4 and inside the inner outline of the trench T4 (in the region enclosed by the first, second, third, and fourth trench parts of the trench T4). In other words, the trenches T4 are formed within the p-type region PFp, but in the regions located outside the trenches T4 and inside the inner outlines of the trenches T4 in plan view, the $n^-$-type drift region ND is formed in the depth direction (–Z direction) from the upper surface Sa of the semiconductor substrate SS to reach an $n^-$-type field stop region Ns.

The gate insulating film GI is formed at the inner wall of the trench T4. Within the trench T4, a trench gate electrode TG4 is formed over the gate insulating film GI to fill each trench T4 therewith. An extraction electrode TGz is formed to cover the gate wiring lead-out region AR2. The extraction electrode TGz is formed integrally with a plurality of trench gate electrodes TG4.

Each trench T1 extends from the inside of the cell formation region AR1 toward the gate wiring lead-out region AR2 in the Y direction. Within the trench T1, a trench gate electrode TG1 is formed to fill the trench T1 therewith. The trench T1 extending from the inside of the cell formation region AR1 has its end coupled to any of the trenches T4. That is, the trench gate electrode TG1 extending from the inside of the cell formation region AR1 has its end coupled to any of the trench gate electrodes TG4. Thus, the trench gate electrode TG1 can be electrically coupled to all trench gate electrodes TG4 via the extraction electrode TGz.

Further, the interlayer insulating film IL is formed to cover the extraction electrode TGz. Note that the insulating film IF is formed between the extraction electrode TGz and the interlayer insulating film IL. The contact trenches (openings) CTp are formed in the interlayer insulating film IL. The contact trenches CTp are formed in contact with the extraction electrode TGz.

The connection electrode CPp is formed inside the contact trench CTp. The connection electrode CPp is in contact with the extraction electrode TGz. A gate wiring GL is formed of a conductive film over the interlayer insulating film IL, and the gate wiring GL is coupled to the extraction electrode TGz via the contact trench CTp. In the first embodiment, the connection electrode CPp and the gate wiring GL are integrally formed.

Thus, the trench gate electrode TG1 formed in the cell formation region AR1 is electrically coupled to the gate electrode GE (see FIG. 1) via the trench gate electrode TG4, extraction electrode TGz, connection electrode CPp, and gate wiring GL formed in the gate wiring lead-out region AR2.

Although not shown, an insulating film (passivation film) is further formed of, for example, a polyimide-based organic insulating film or the like, over the gate wiring GL.

The feature of the semiconductor device in the first embodiment is that a plurality of trench gate electrodes TG4 is formed as control means for a gate capacitance in the gate wiring lead-out region AR2. Note that if no p-type region PFp is formed in the gate wiring lead-out region AR2, a desired breakdown voltage between the collector and emitter cannot obtained. For this reason, it is necessary to form the p-type region PFp in the gate wiring lead-out region AR2. However, if the p-type region PFp having the emitter potential is formed in the entire gate wiring lead-out region AR2, the formation of the trench gate electrodes TG4 increases just a capacitance between the gate and emitter, and does not increase a capacitance between the gate and collector (reverse transfer capacitance).

In the semiconductor device of the first embodiment, the trench T4 filled with the trench gate electrode TG4 has a shape enclosed by a rectangular outer outline and a rectangular inner outline in plan view. The p-type region PFp is formed outside the trenches T4 and between the adjacent trenches T4 and T4, while the p-type region PFp is not formed in a region located outside the trench T4 and inside the inner outline of the trench T4 in plan view.

An n-type semiconductor region is formed in a part with no p-type region PFp. The n-type semiconductor region leads to the n$^-$-type drift region ND and is in contact with the gate insulating film GI formed at the inner wall of the inner outline of the trench T4. In the first embodiment, the n-type semiconductor region is formed by the n$^-$-type drift region ND. Thus, the part with no p-type region PFp therein forms a gate-collector capacitance (reverse transfer capacitance) that includes the trench gate electrode TG4 formed inside the trench T4, the gate insulating film GI, and the n$^-$-type drift region ND.

In the gate wiring lead-out region AR2, the region with no p-type region PFp (region in contact with the inner outline of the trench T4 in plan view) and the region with the p-type region PFp (region in contact with the outer outline of the trench T4 in plan view) can be completely separated from each other by the trench T4.

In this way, in the gate wiring lead-out region AR2, the n$^-$-type drift region ND is formed in the region located outside the trench T4 and inside the inner outline of the trench T4 in plan view, so that a capacitance formed between the n$^-$-type drift region ND and the trench gate electrode TG4 formed in the trench T4 can be used as a gate-collector capacitance (reverse transfer capacitance). Furthermore, the p-type region PFp is formed, thereby making it possible to possess an adequate breakdown voltage between the collector and emitter.

If an interval between the adjacent trenches T4 and T4 is narrow, the breakdown voltage between the collector and emitter is not reduced by the field plate effect. This is because, when turned off, the gate potential becomes at the same potential of 0 V as the emitter potential, and the p-type region PFp also becomes 0 V as the emitter potential, thereby setting the surroundings of a region between the collector and emitter to be at a potential of 0V, making it less likely to concentrate the field strength and thereby to reduce the breakdown voltage. The interval between the adjacent trenches T4 and T4 in the X direction is desirably 5.0 μm or less. A suitable interval can be, for example, 2.26 μm.

Hole current flows into the entire lower surface Sb of the semiconductor substrate SS, and the hole current (as indicated by thick arrows in FIG. 2) flowing from its outer region enters the contact trenches CT at the emitter potential through the p-type region PFp. Thus, in the first embodiment, the trenches T4 are formed spaced apart from each other in the X direction. This ensures a route for the hole current flowing from the outer region, allowing the hole current to easily flow into the contact trenches CT at the emitter potential through the p-type region PFp.

When forming the trench T4 extending in the X direction, the hole current flowing from the outer region passes through the p-type region PFp under the bottom surface of the trench T4. The p-type region PFp located under the bottom surface of the trench T4 has a low impurity concentration and has its route narrowed, resulting in a high resistance, which might degrade the breakdown resistance due to heat generation.

In contrast, according to the first embodiment, as mentioned above, the route not interrupting the flow of hole current can be ensured to suppress the degradation in breakdown resistance.

Method for Manufacturing Semiconductor Device

A method for manufacturing a semiconductor device in this embodiment (cell formation region AR1 and gate wiring lead-out region AR2) will be described below with reference to FIGS. 8 to 37. FIGS. 8 to 37 show cross-sectional views taken along the line E-E' of the cell formation region AR1 or along the line B-B' of the gate wiring lead-out region AR2 as shown in FIG. 2.

Figure 8:
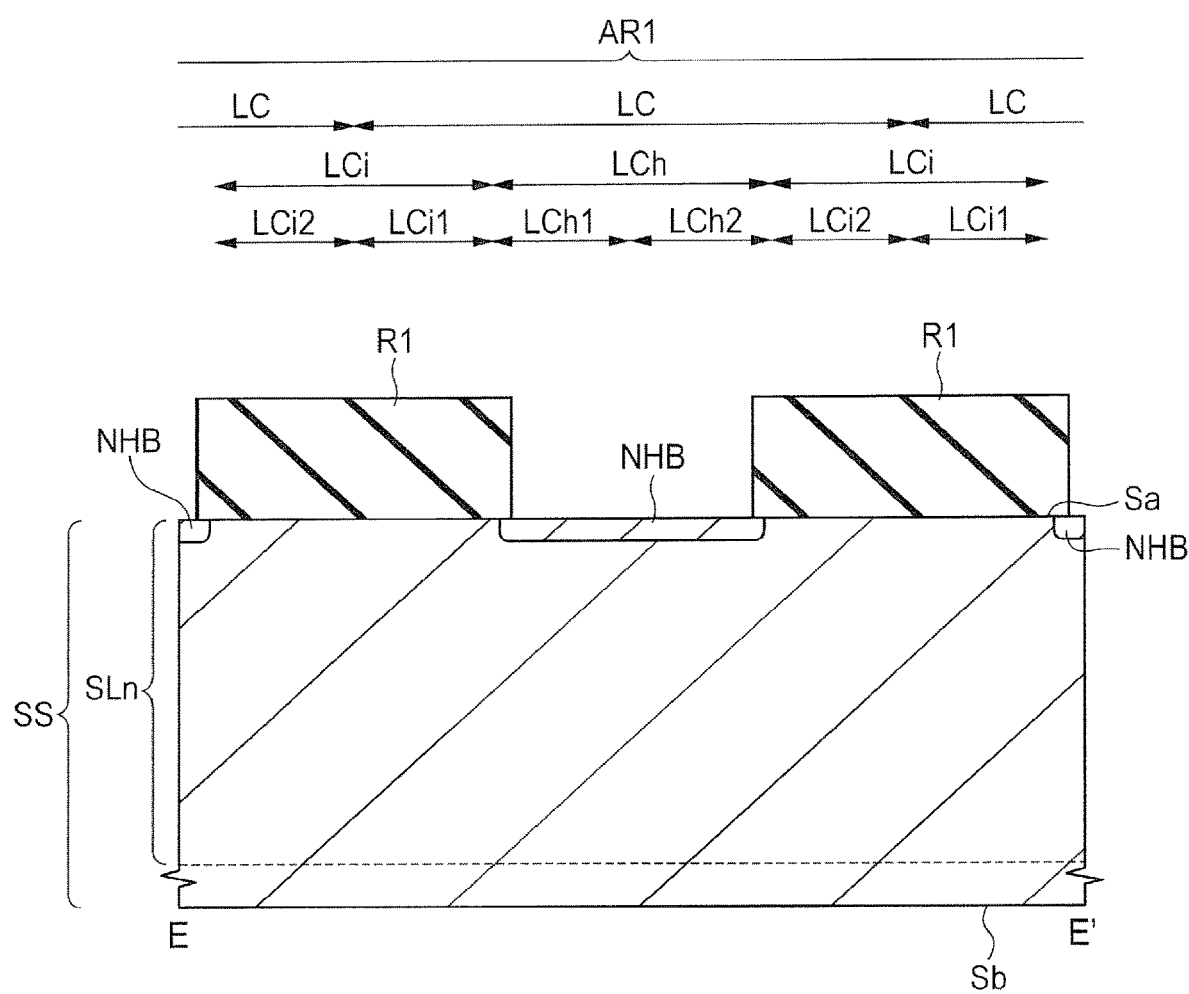
FIG. 8 is a cross-sectional view (cross-sectional view taken along the line E-E' of FIG. 2) of a manufacturing step for the semiconductor device in the first embodiment.
Figure 9:
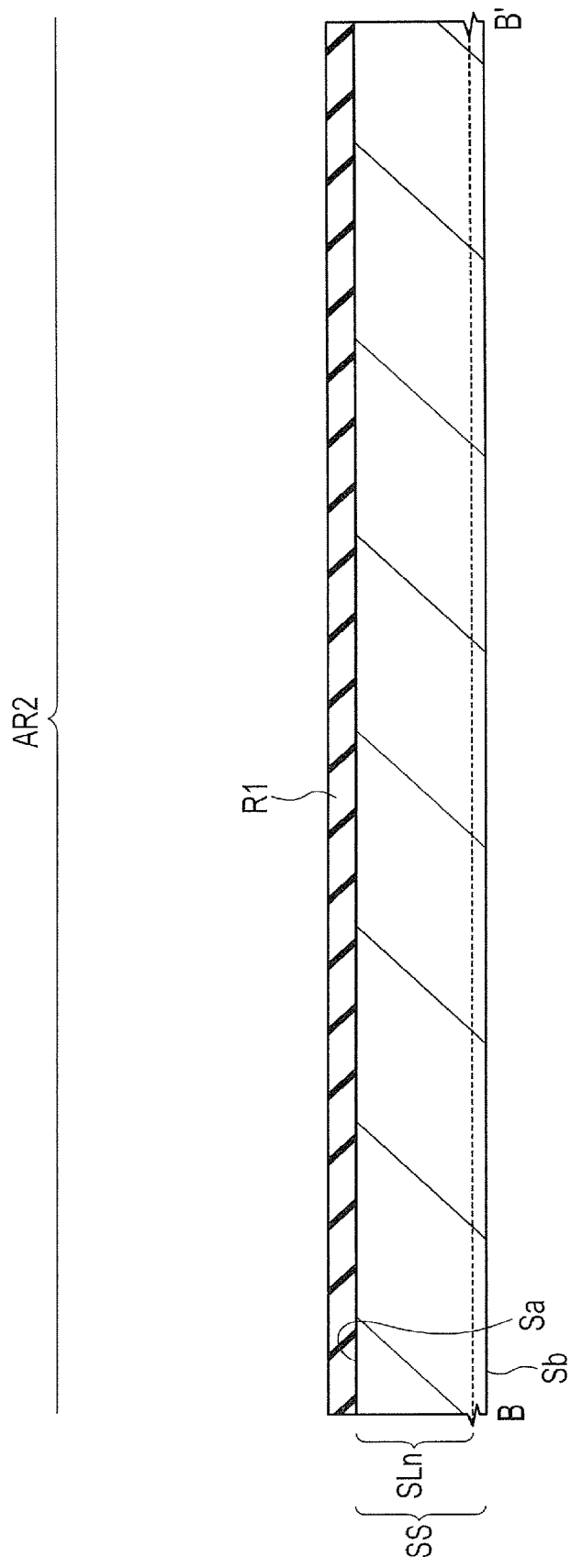
FIG. 9 is another a cross-sectional view (cross-sectional view taken along the line B-B' of FIG. 2) of the manufacturing step for the semiconductor device in the first embodiment.

First, as shown in FIGS. 8 and 9, a semiconductor substrate SS made of, for example, single crystal silicon (Si), with n-type impurities, such as phosphorus (p), introduced thereinto, is provided. The semiconductor substrate SS has an upper surface Sa as the first main surface and a lower surface Sb opposite to the upper surface Sa as the second main surface.

The semiconductor substrate SS contains n-type impurities. The impurity concentration is, for example, approximately $2 \times 10^{14}$ cm$^{-3}$. The semiconductor substrate SS in this stage is a thin semiconductor plate having a substantially circular planar shape, called a wafer. The thickness of the semiconductor substrate SS is, for example, in a range of approximately 450 μm to 1000 μm. A layer in the semiconductor substrate SS extending from the upper surface Sa in the predetermined depth is a semiconductor layer SLn.

Then, a resist film R1 for introduction of an n-type hole barrier region is formed over the upper surface Sa of the semiconductor substrate SS by coating and the like, and then patterned by normal photolithography (exposure and development), thereby forming the resist film R1 having an opening in each hybrid cell regions LCh. Using the resist film R1 as a mask, n-type impurities are introduced into the upper surface Sa of the semiconductor substrate SS, for example, by ion implantation to thereby form an n-type hole barrier region NHB. At this time, suitable conditions for the ion implantation can be, for example, ion species of phosphorus (P), a dose amount of approximately $6 \times 10^{12}$ cm$^{-2}$, and an implantation energy of about 80 KeV. Thereafter, unnecessary parts of the resist film R1 are removed by asking and the like.

Figure 10:
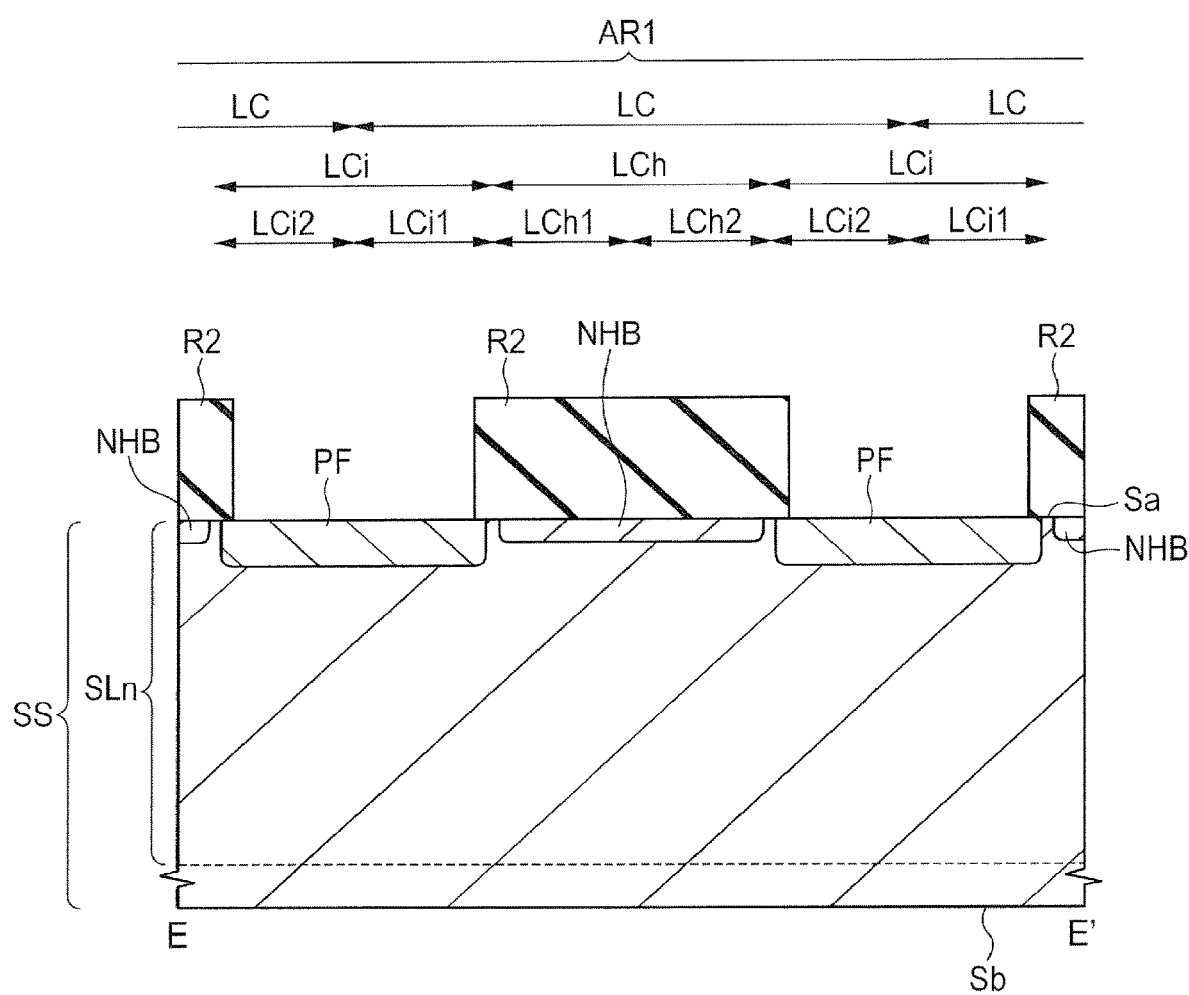
FIG. 10 is a cross-sectional view (taken along the line E-E') of another manufacturing step for the semiconductor device, following the step shown in FIGS. 8 and 9.
Figure 11:
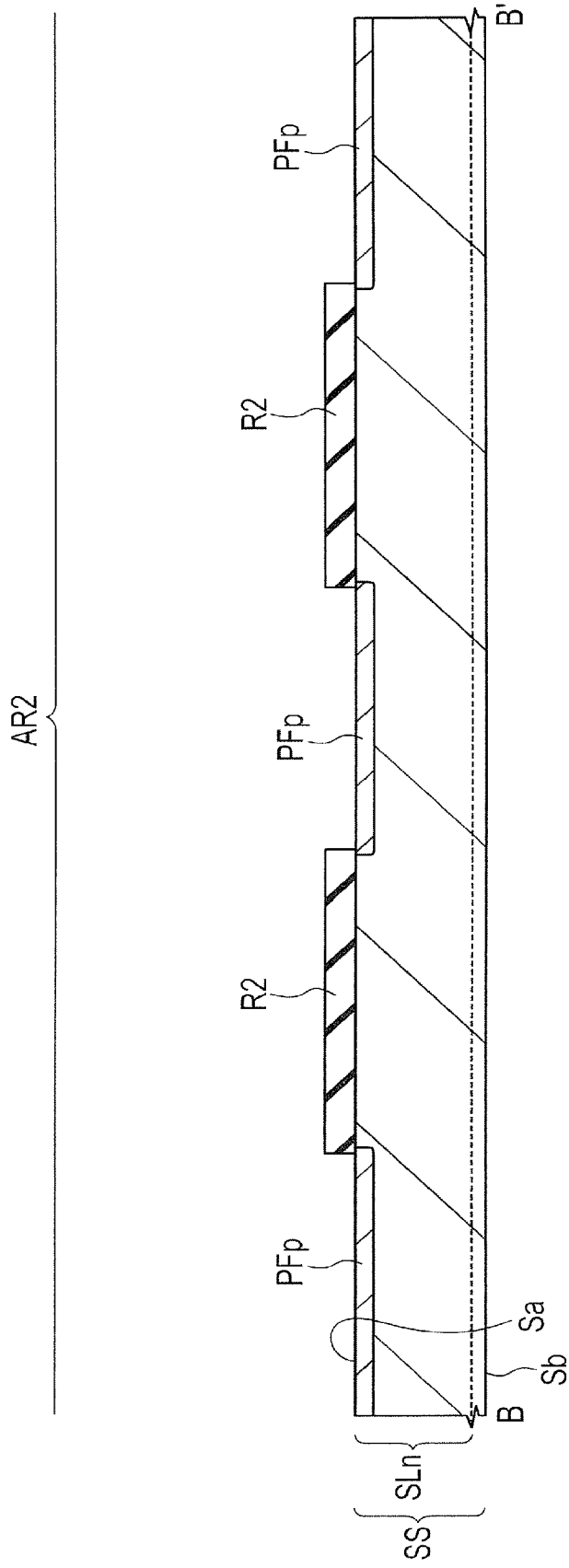
FIG. 11 is another cross-sectional view (taken along the line B-B') of the manufacturing step for the semiconductor device, following the step shown in FIGS. 8 and 9.

Then, as shown in FIGS. 10 and 11, a resist film R2 for introduction of a p-type floating region is formed over the upper surface Sa of the semiconductor substrate SS by coating and the like, and then patterned by the normal photolithography (exposure and development), thereby forming the resist film R2 having openings in the inactive cell region LCi and the gate wiring lead-out region AR2. Using the resist film R2 as a mask, p-type impurities are introduced into the upper surface Sa of the semiconductor substrate SS, for example, by ion implantation, thereby forming a p-type floating region PF in the cell formation region AR1, as well as a p-type region PFp in the gate wiring lead-out area AR2. At this time, suitable conditions for the ion implantation can be, for example, ion species of boron (B), a dose amount of approximately $3.5 \times 10^{13}$ cm$^{-2}$, and an implantation energy of about 75 KeV. Thereafter, unnecessary parts of the resist film R2 are removed by ashing and the like.

Figure 12:
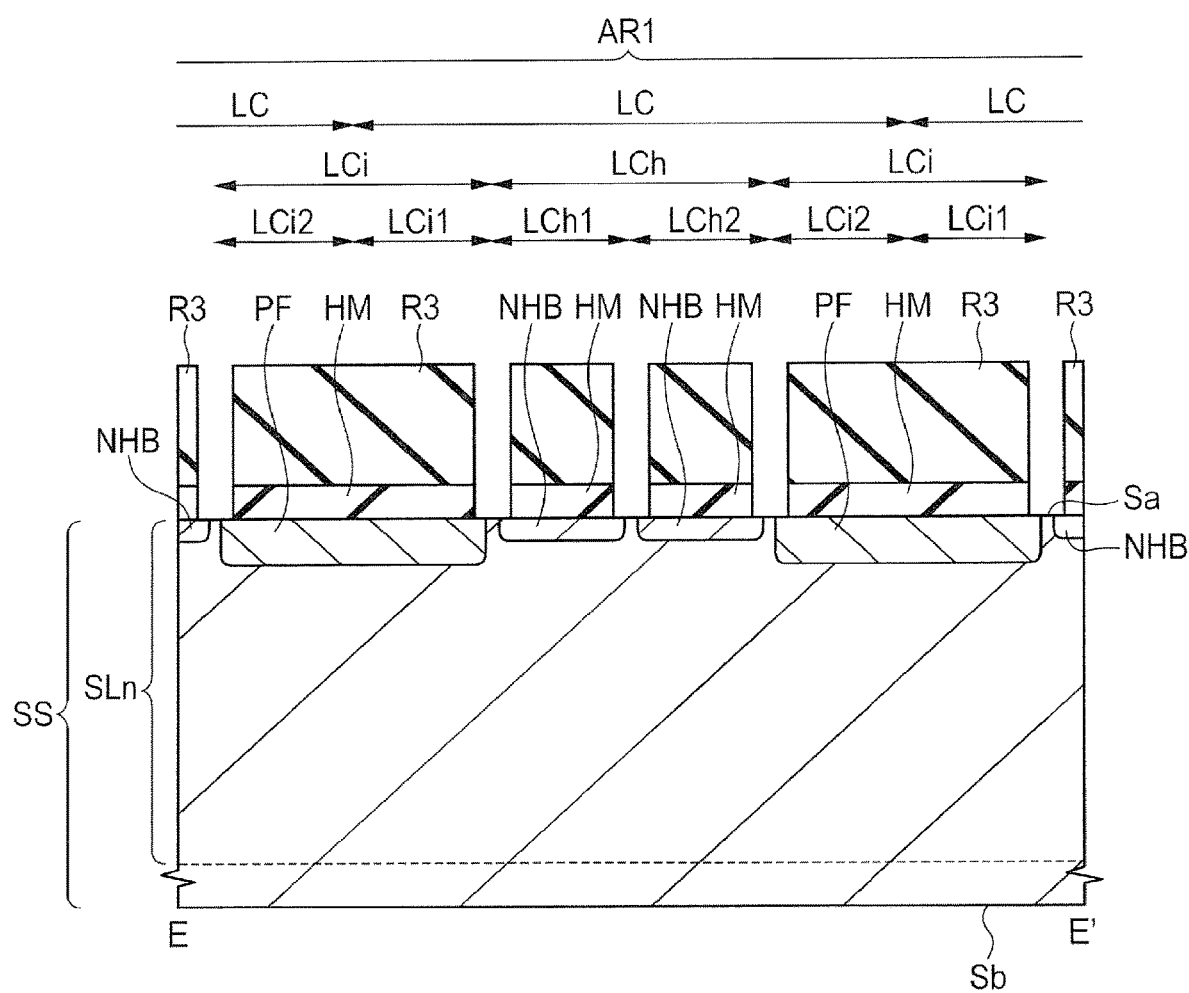
FIG. 12 is a cross-sectional view (taken along the line E-E') of another manufacturing step for the semiconductor device, following the step shown in FIGS. 10 and 11.
Figure 13:
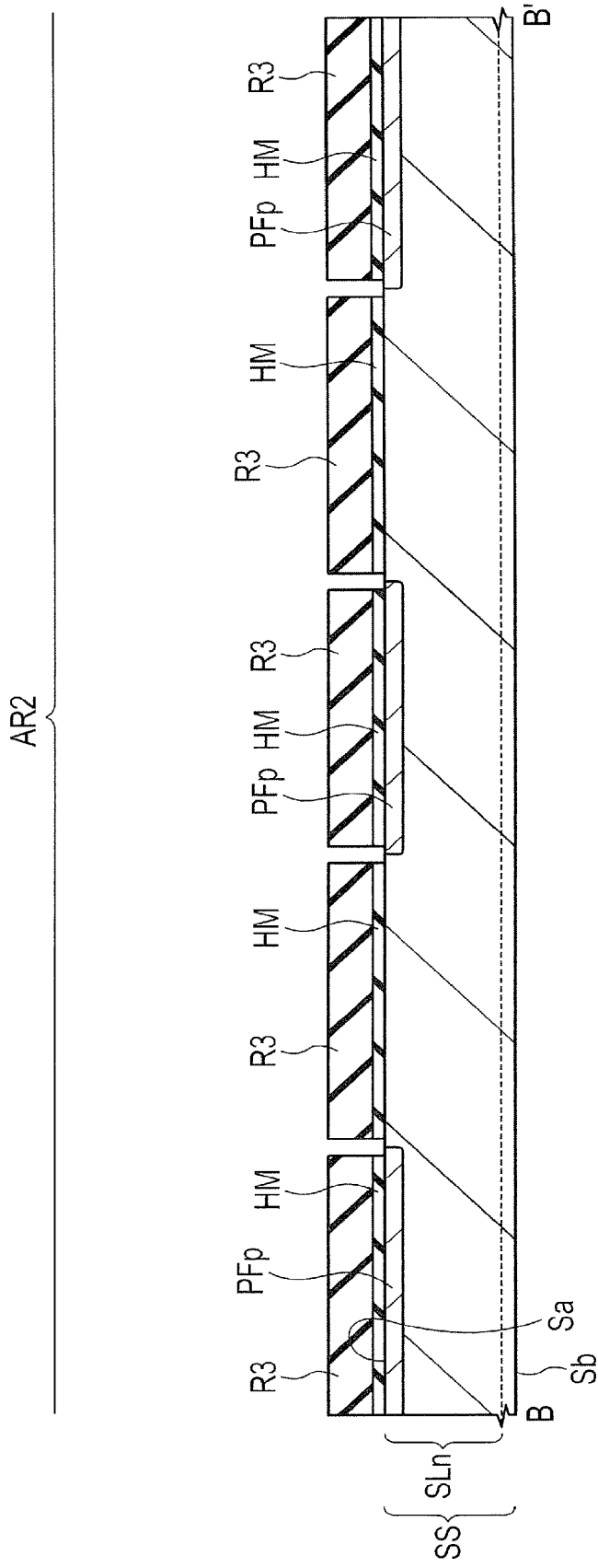
FIG. 13 is another cross-sectional view (taken along the line B-B') of the manufacturing step for the semiconductor device, following the step shown in FIGS. 10 and 11.

Next, as shown in FIGS. 12 and 13, a hard mask film HM is formed of, for example, silicon oxide ($SiO_2$), over the upper surface Sa of the semiconductor substrate SS, for example, by a chemical vapor deposition (CVD) method. The thickness of the hard mask film HM is, for example, approximately 450 nm.

Then, a resist film R3 for processing of the hard mask film is formed over the upper surface Sa of the semiconductor substrate SS by coating and the like, and then patterned by normal photolithography (exposure and development), thereby forming the resist film R3 having an opening in each trench formation region. Using the resist film R3 as a mask, the hard mask film HM is patterned, for example, by dry etching. Thereafter, unnecessary parts of the resist film R3 are removed by ashing and the like.

Figure 14:
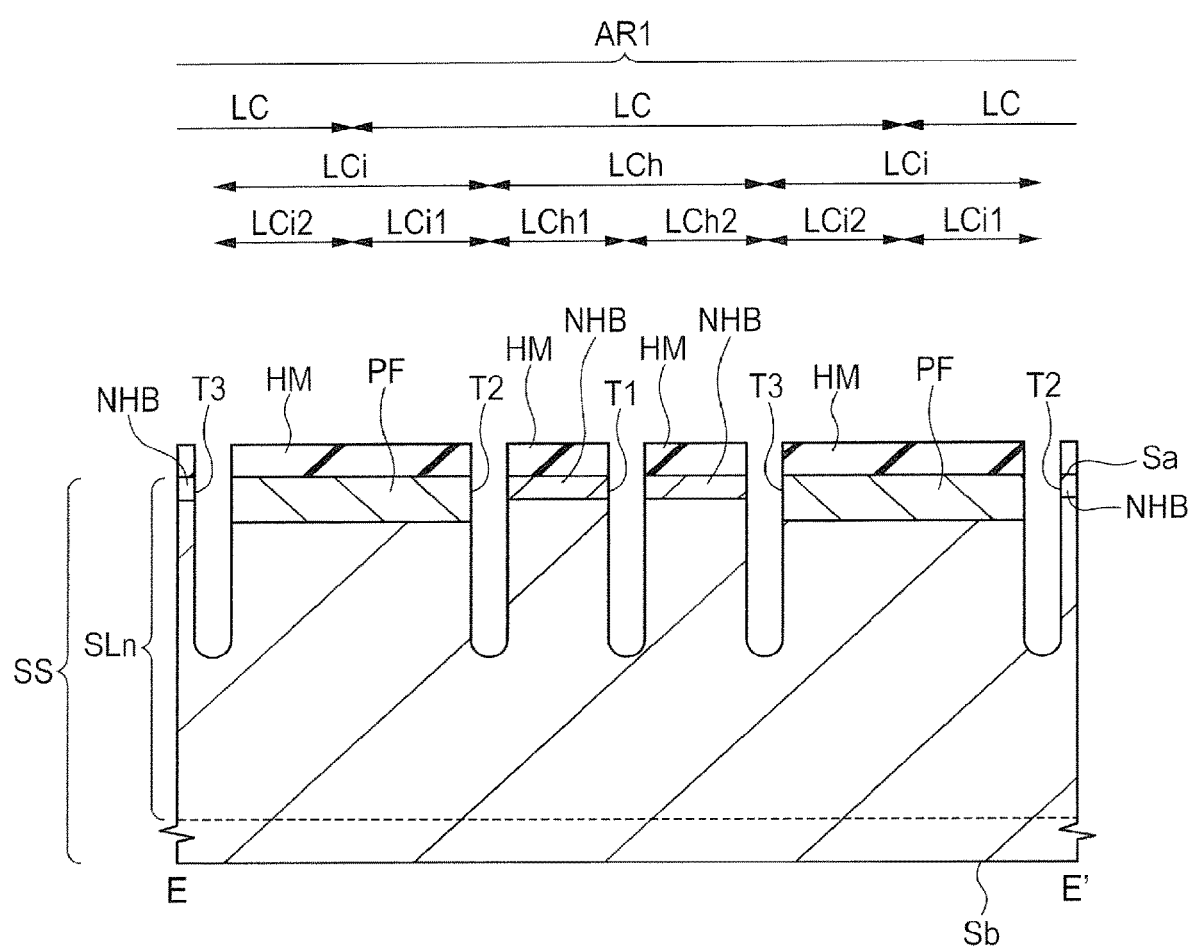
FIG. 14 is a cross-sectional view (taken along the line E-E') of another manufacturing step for the semiconductor device, following the step shown in FIGS. 12 and 13.
Figure 15:
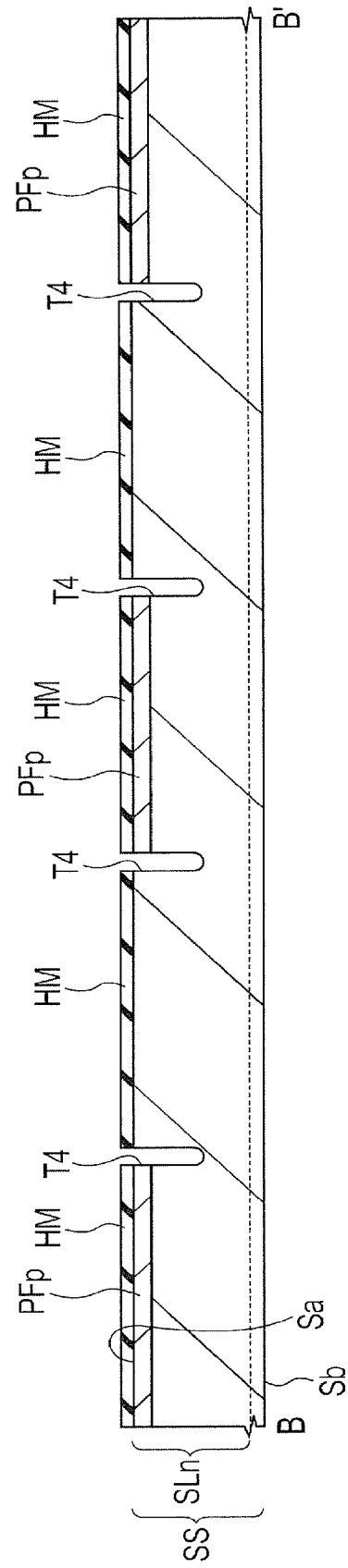
FIG. 15 is another cross-sectional view (taken along the line B-B') of the manufacturing step for the semiconductor device, following the step shown in FIGS. 12 and 13.

Then, as shown in FIGS. 14 and 15, trenches T1, T2, T3, and T4 are formed, for example, by anisotropic dry etching, using the remaining hard mask film HM. At this time, in the cell formation region AR1, the trench T1 is formed to reach the midway point of the semiconductor layer SLn from the upper surface Sa of the semiconductor substrate SS and to extend in the Y direction in plan view (see FIG. 2). The trenches T2 and T3 are formed to respectively reach the midway points of the semiconductor layer SLn from the upper surface Sa of the semiconductor substrate SS, to be disposed on both sides of the trench T1 with the trench T1 sandwiched therebetween, and to respectively extend in the Y direction in plan view (see FIG. 2). Furthermore, in the gate wiring lead-out region AR2, the trench T4 is formed to reach the midway point of the semiconductor layer SLn from the upper surface Sa of the semiconductor substrate SS and to have a shape enclosed by a rectangular outer outline and a rectangular inner outline in plan view (see FIG. 2). Suitable gas for the anisotropic dry etching can be, for example, $Cl_2/O_2$ based gas.

Figure 16:
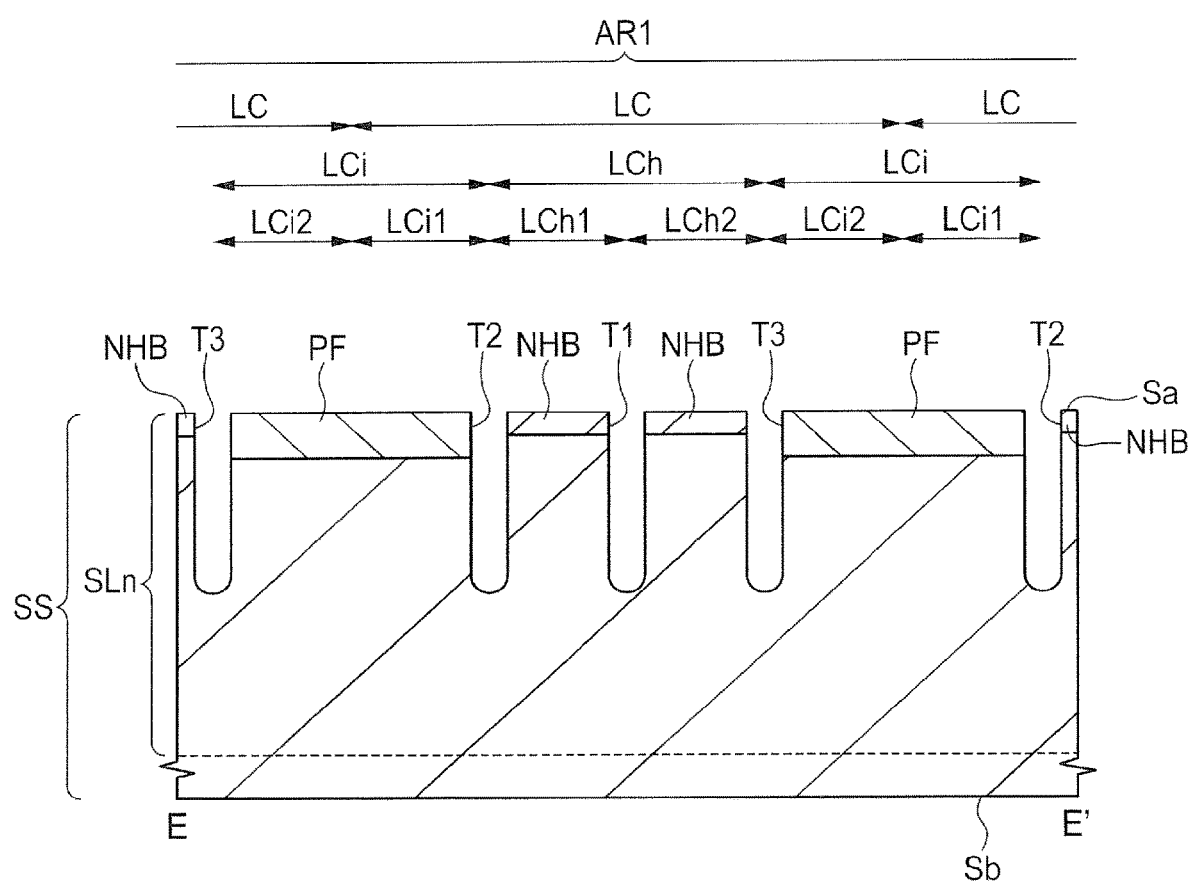
FIG. 16 is a cross-sectional view (taken along the line E-E') of another manufacturing step for the semiconductor device, following the step shown in FIGS. 14 and 15.
Figure 17:
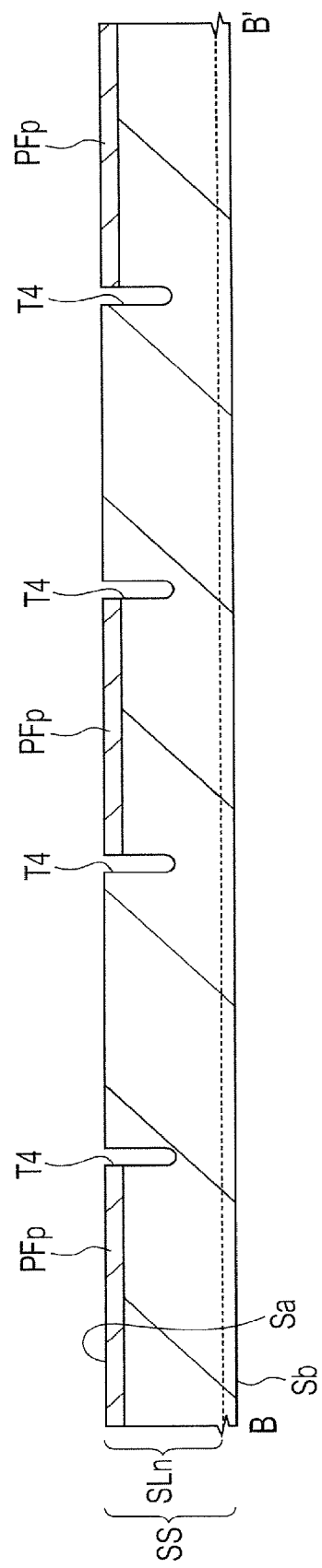
FIG. 17 is another cross-sectional view (taken along the line B-B') of the manufacturing step for the semiconductor device, following the step shown in FIGS. 14 and 15.

Thereafter, as shown in FIGS. 16 and 17, for example, unnecessary parts of the hard mask film HM are removed by wet etching, for example, using a hydrofluoric acid-based etchant.

Figure 18:
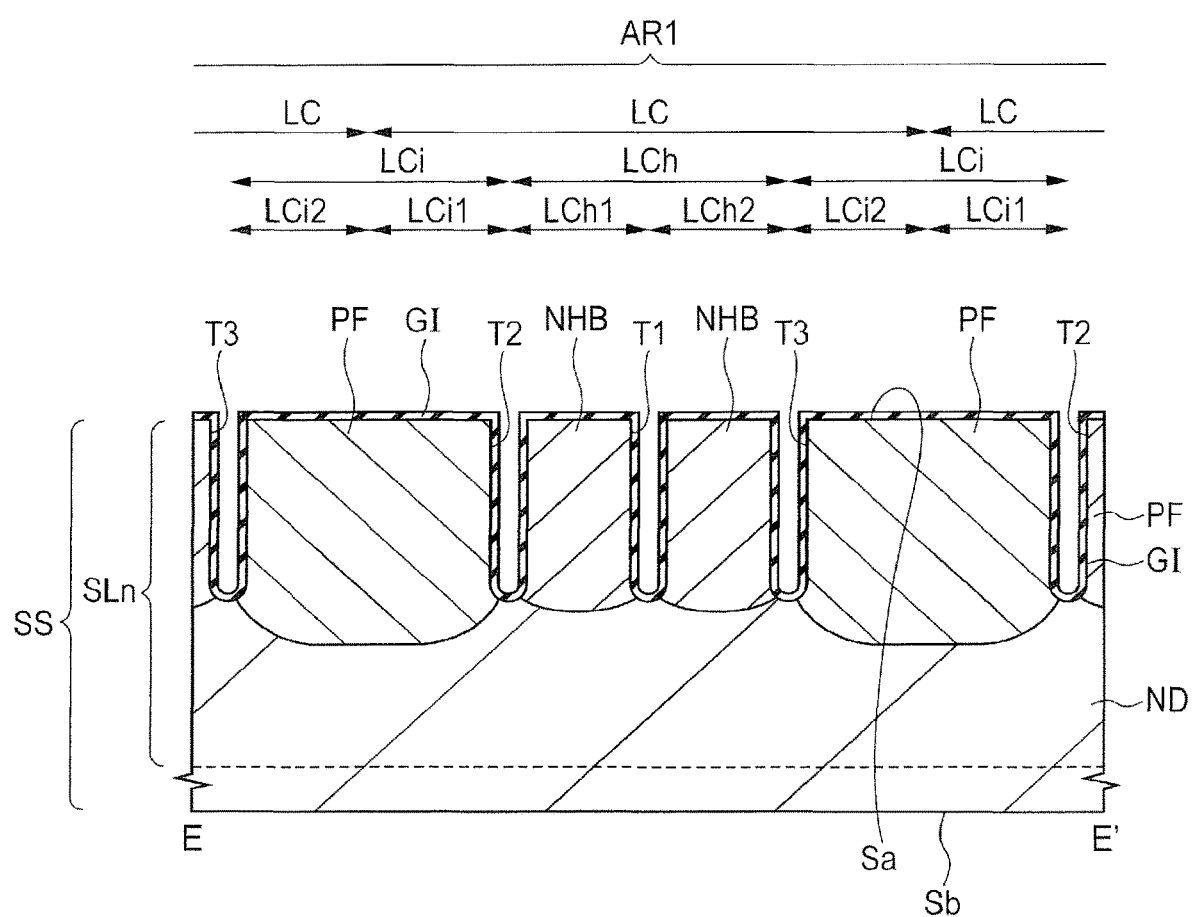
FIG. 18 is a cross-sectional view (taken along the line E-E') of another manufacturing step for the semiconductor device, following the step shown in FIGS. 16 and 17.
Figure 19:
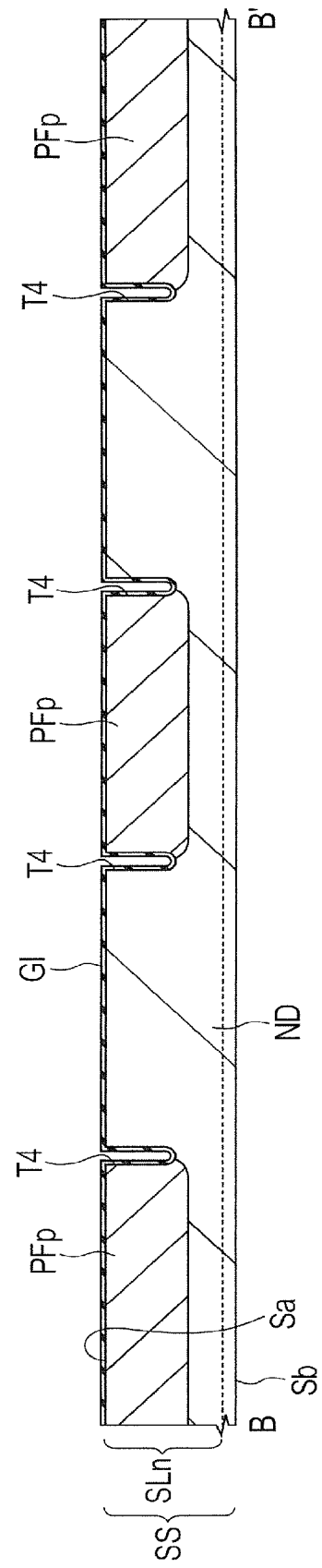
FIG. 19 is another cross-sectional view (taken along the line B-B') of the manufacturing step for the semiconductor device, following the step shown in FIGS. 16 and 17.

Then, as shown in FIGS. 18 and 19, extension diffusion (for example, at 1200° C. and for about 30 minutes) is performed on the p-type floating regions PF and p-type regions PFp as well as the n-type hole barrier region NHB. At this time, the extension diffusion is performed such that the lower surfaces of the p-type floating regions PF and p-type regions PFp are positioned at lower levels than the lower surfaces of the trenches T1, T2, T3, and T4.

Next, a gate insulating film GI is formed of, for example, silicon oxide ($SiO_2$), over the upper surface Sa of the semiconductor substrate SS and the inner wall of each of the trenches T1, T2, T3, and T4, for example, by the thermal oxidation method or the like. The thickness of the gate insulating film GI is, for example, about 0.12 μm.

In the cell formation region AR1, a p-type floating region PF is formed between the trench T3 located on the left end and the adjacent trench T2 as shown in FIG. 18, and a p-type floating region PF is formed between the trench T2 located on the right end and the adjacent trench T3 as shown in FIG. 18, by the above-mentioned extension diffusion. Preferably, the p-type floating region PF is in contact with each of the gate insulating films GI formed at the inner wall of the trench T2 and the inner wall of the trench T3.

N-type hole barrier regions NHB are respectively formed between the trench T1 and the adjacent trench T2 and between the trench T1 and the adjacent trench T3. Preferably, the n-type hole barrier region NHB formed between the trenches T1 and T2 is in contact with the gate insulating film GI formed at the inner wall of the trench T1, and with the gate insulating film GI formed at the inner wall of the trench T2. Further, preferably, the n-type hole barrier region NHB formed between the trenches T1 and T3 is in contact with the gate insulating film GI formed at the inner wall of the trench T1, and with the gate insulating film GI formed at the inner wall of the trench T3.

In the above-mentioned extension diffusion, part of the n-type semiconductor substrate SS where the p-type floating region PF and the n-type hole barrier region NHB are not formed becomes an n$^-$-type drift region ND. In other words, part of the n-type semiconductor layer SLn, where the p-type floating region PF and the n-type hole barrier region NHB are not formed, becomes the n$^-$-type drift region ND. Note that in a step shown in FIG. 18, the n$^-$-type drift region ND is formed from the inside of the semiconductor layer SLn up to the lower surface Sb of the semiconductor substrate SS.

Between the trenches T1 and T2, the n-type impurity concentration in the n-type hole barrier region NHB is higher than the n-type impurity concentration in the n$^-$-type drift region ND and lower than that of the n$^+$-type emitter region NE to be described later. The same goes for a region between the trenches T1 and T3.

In the gate wiring lead-out region AR2, the p-type region PFp is formed outside the trenches T4 and between the adjacent trenches T4 and T4 by the above-mentioned extension diffusion. Preferably, the p-type region PFp formed between the trenches T4 and T4 is in contact with the gate insulating film GI formed at the inner wall of the trench T4.

Figure 20:
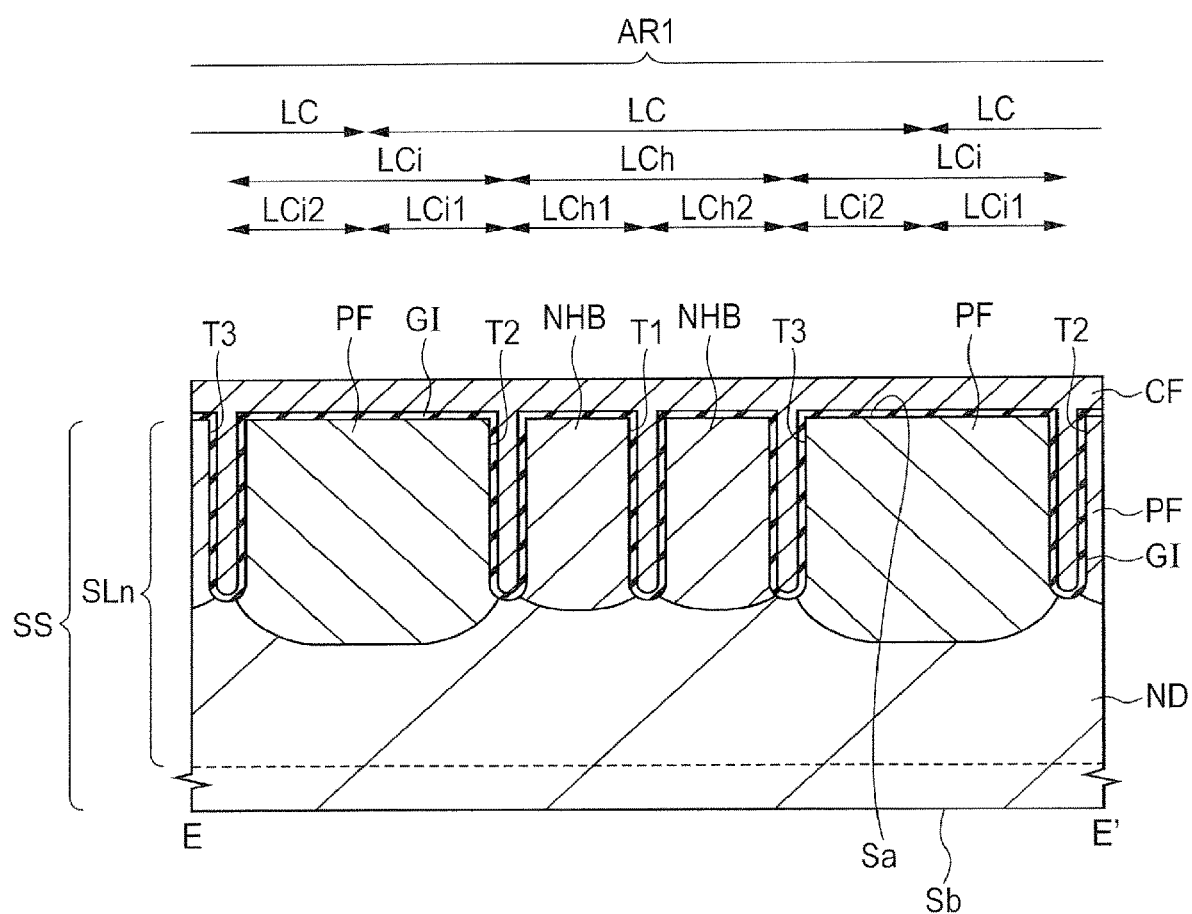
FIG. 20 is a cross-sectional view (taken along the line E-E') of another manufacturing step for the semiconductor device, following the step shown in FIGS. 18 and 19.
Figure 21:
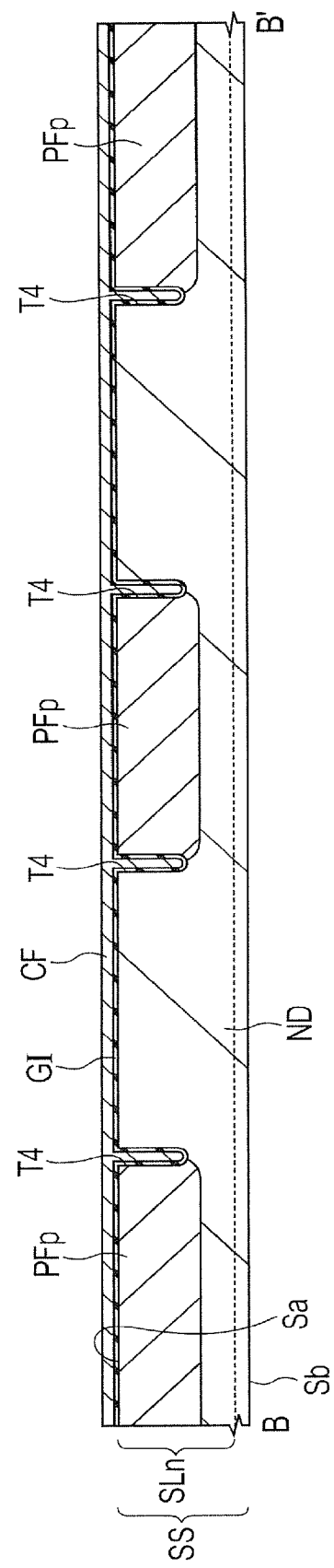
FIG. 21 is another cross-sectional view (taken along the line B-B') of the manufacturing step for the semiconductor device, following the step shown in FIGS. 18 and 19.

Then, as shown in FIGS. 20 and 21, a conductive film CF made of polycrystalline silicon (doped poly-silicon) with phosphorus (P) doped therein is deposited over the upper surface Sa of the semiconductor substrate SS and inside the trenches T1, T2, T3, and T4, for example, by the CVD method and the like. The thickness of the conductive film CF is, for example, in a range of approximately 0.5 μm to 1.5 μm.

Figure 22:
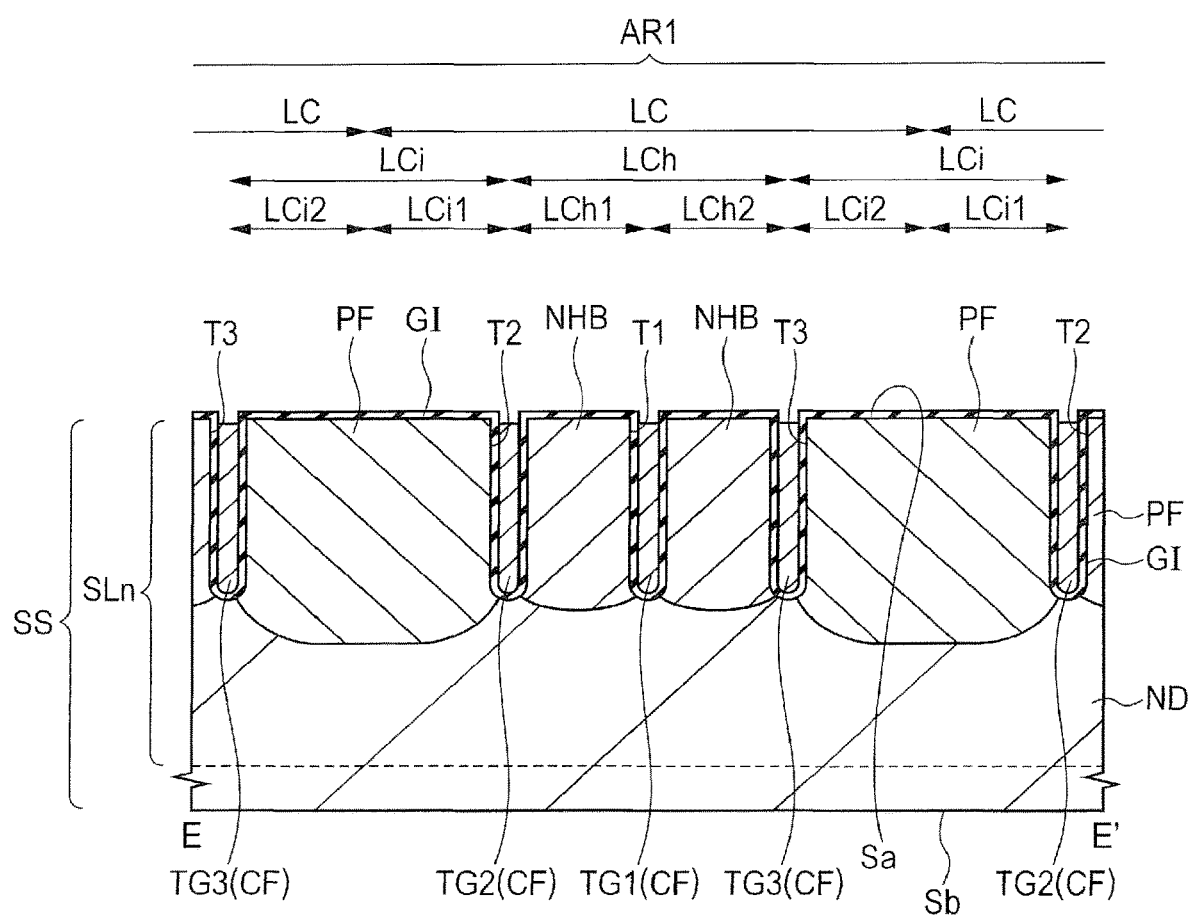
FIG. 22 is a cross-sectional view (taken along the line E-E') of another manufacturing step for the semiconductor device, following the step shown in FIGS. 20 and 21.
Figure 23:
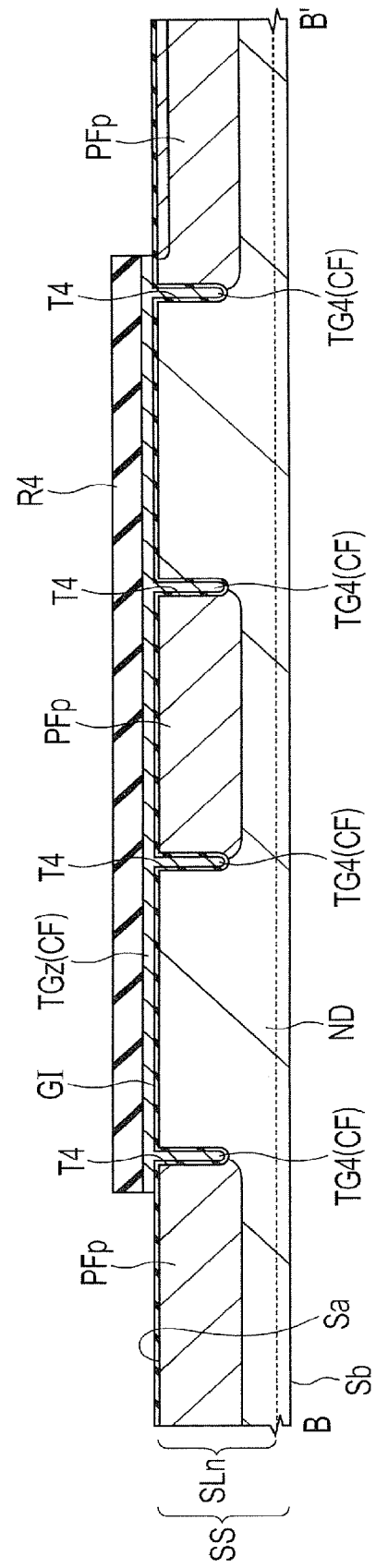
FIG. 23 is another cross-sectional view (taken along the line B-B') of the manufacturing step for the semiconductor device, following the step shown in FIGS. 20 and 21.

Then, as shown in FIGS. 22 and 23, a resist film R4 for processing of the extraction electrode is formed by coating or the like over the upper surface Sa of the semiconductor substrate SS, and then patterned by normal photolithography (exposure and development), thereby forming the resist film R4 covering an extraction-electrode formation region. Using the resist film R4 as a mask, the conductive film CF is patterned, for example, by dry etching. At this time, the etching conditions are adjusted to leave (etch-back) the conductive film CF inside each of the trenches T1, T2, and T3.

In this way, in the cell formation region AR1, a trench gate electrode TG1 is formed of the conductive film CF embedded in the trench T1 via the gate insulating film GI. A trench gate electrode TG2 is formed of the conductive film CF embedded in the trench T2 via the gate insulating film GI. A trench gate electrode TG3 is formed of the conductive film CF embedded in the trench T3 via the gate insulating film GI. An extraction electrode TGz is formed in the gate wiring lead-out region AR2. A trench gate electrode TG4 is formed of the conductive film CF embedded in the trench T4 via the gate insulating film GI. The extraction electrode TGz is integrally formed with the trench gate electrode TG4.

In other words, in the cell formation region AR1, over the gate insulating film GI, the trench gate electrode TG1 is formed to fill the trench T1 therewith; the trench gate electrode TG2 is formed to fill the trench T2 therewith; and the trench gate electrode TG3 is formed to fill the trench T3 therewith. Further, in the gate wiring lead-out region AR2, over the gate insulating film GI, the trench gate electrode TG4 is formed to fill the trench T4 therewith; and the extraction electrode TGz is formed integrally with the trench gate electrodes TG4 to cover the gate wiring lead-out region AR2. Suitable etching gases can be, for example, $SF_6$ gas. Thereafter, unnecessary parts of the resist film R4 are removed by asking and the like.

Figure 24:
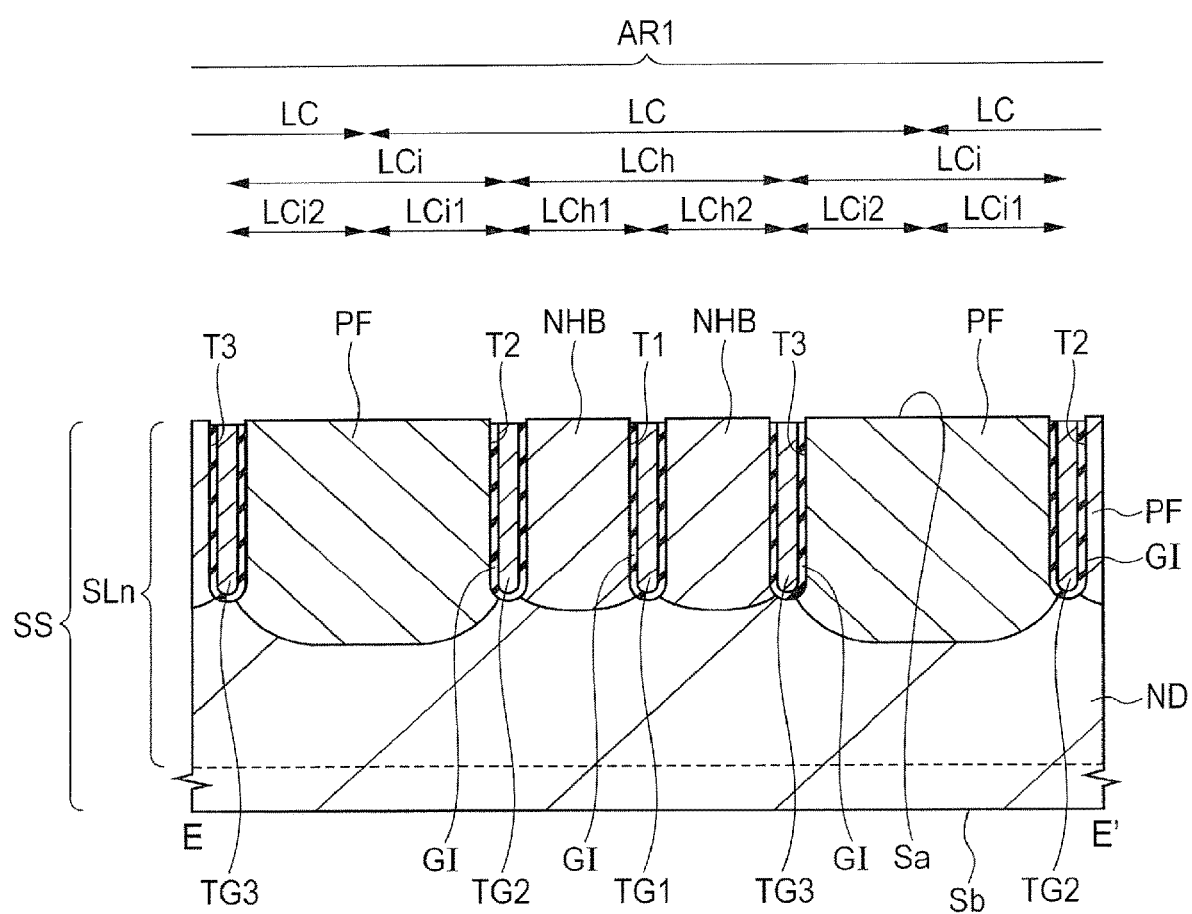
FIG. 24 is a cross-sectional view (taken along the line E-E') of another manufacturing step for the semiconductor device, following the step shown in FIGS. 22 and 23.
Figure 25:
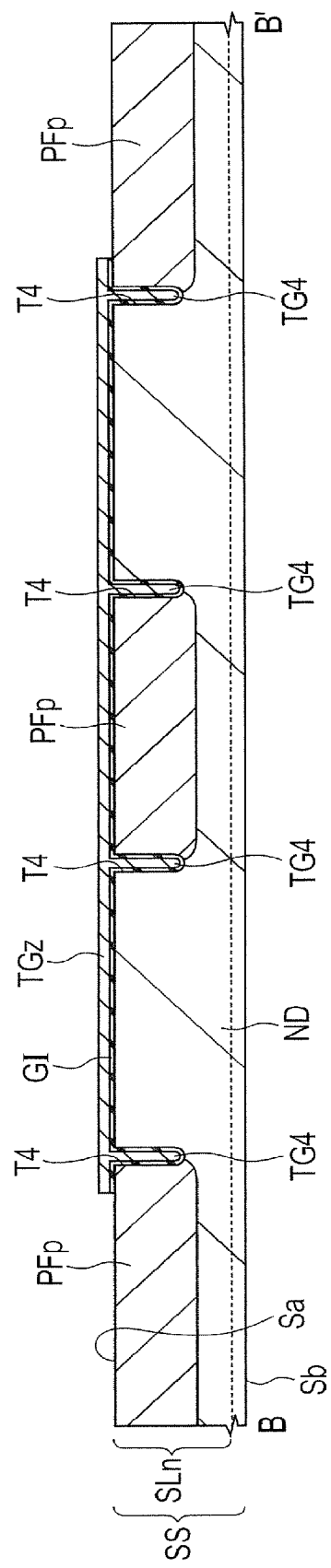
FIG. 25 is another cross-sectional view (taken along the line B-B') of the manufacturing step for the semiconductor device, following the step shown in FIGS. 22 and 23.

Then, as shown in FIGS. 24 and 25, the gate insulating film GI, except for parts thereof located at the insides of the trenches T1, T2, and T3 as well as parts thereof covered with the extraction electrode TGz, are removed by dry etching and the like.

Figure 26:
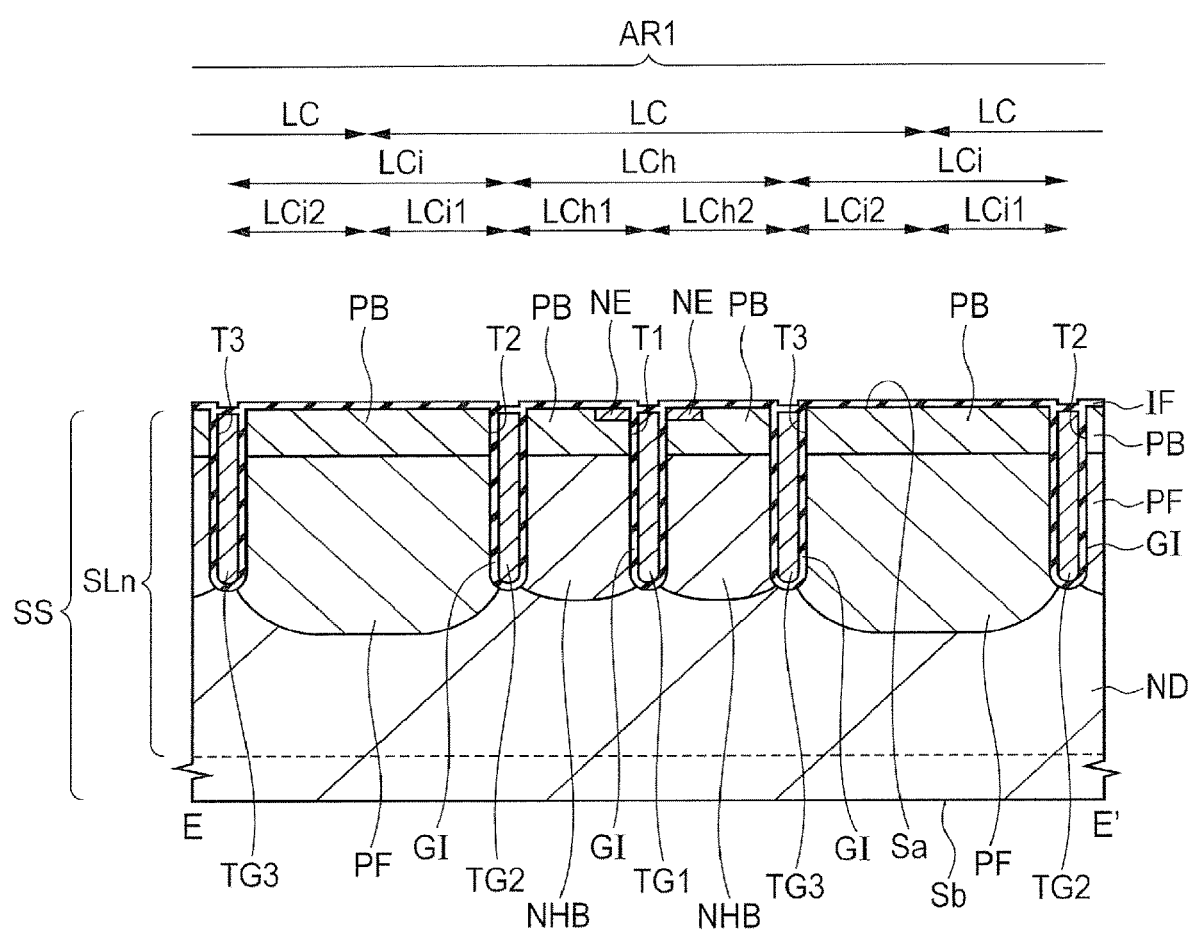
FIG. 26 is a cross-sectional view (taken along the line E-E') of another manufacturing step for the semiconductor device, following the step shown in FIGS. 24 and 25.
Figure 27:
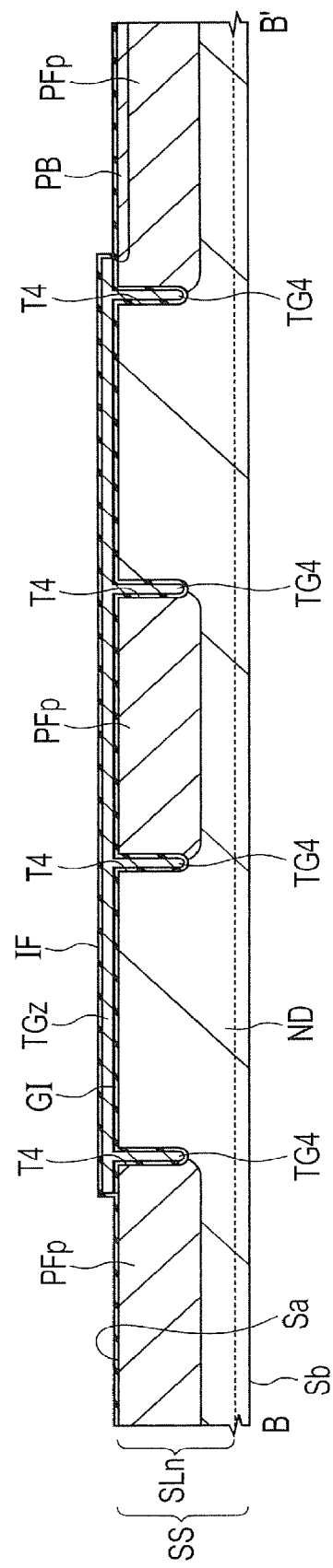
FIG. 27 is another cross-sectional view (taken along the line B-B') of the manufacturing step for the semiconductor device, following the step shown in FIGS. 24 and 25.

Then, as shown in FIGS. 26 and 27, an insulating film IF made of a relatively thin silicon oxide ($SiO_2$) film (for example, having the substantially same thickness as that of the gate insulating film GI) is formed over the upper surface Sa of the semiconductor substrate SS and the upper surface and side surfaces of the extraction electrode TGz, for example, by the thermal oxidation method or CVD method.

Next, a resist film (not shown) for introduction of the p-type body region is formed over the upper surface Sa of the semiconductor substrate SS by the normal photolithography. A p-type body region PB is formed by introducing p-type impurities into the entire surface and other necessary parts of the cell formation region AR1 using the resist film for introduction of the p-type body region as a mask, for example, by ion implantation.

Specifically, the p-type body region PB is formed between the trenches T1 and T2 to be in contact with the gate insulating film GI formed at the inner wall of the trench T1 and with the gate insulating film GI formed at the inner wall of the trench T2. The p-type body region PB is formed between the trenches T1 and T3 to be in contact with the gate insulating film GI formed at the inner wall of the trench T1 and with the gate insulating film GI formed at the inner wall of the trench T3. The p-type body region PB is formed over the n-type hole barrier region NHB. In the inactive cell region LCi, the p-type body region PB is formed over the p-type floating region PF.

At this time, suitable conditions for the ion implantation can be, for example, ion species of boron (B), a dose amount of approximately $3\times10^{13}$ $cm^{-2}$, and an implantation energy of about 75 KeV. Thereafter, unnecessary parts of the resist film for introduction of the p-type body region are removed by asking and the like.

Further, a resist film (not shown) for introduction of the $n^+$-type emitter region is formed over the upper surface Sa of the semiconductor substrate SS by the normal photolithography. An $n^+$-type emitter region NE is formed by introducing n-type impurities into an upper layer portion of the p-type body region PB in the hybrid cell region LCh using the resist film for introduction of the $n^+$-type emitter region as a mask, for example, by ion implantation. At this time, suitable conditions for the ion implantation can be, for example, ion species of arsenic (As), a dose amount of approximately $5\times10^{15}$ $cm^{-2}$, and an implantation energy of about 80 KeV.

In the hybrid sub-cell regions LCh1 and LCh2, the $n^+$-type emitter regions NE are formed only on the side of the trench gate electrode TG1. Specifically, the $n^+$-type emitter region NE is formed between the trenches T1 and T2 to be in contact with the gate insulating film GI formed at the inner wall of the trench T1 and with the p-type body region PB. The $n^+$-type emitter region NE is formed between the trenches T1 and T3 to be in contact with the gate insulating film GI formed at the inner wall of the trench T1 and with the p-type body region PB. Thereafter, unnecessary parts of the resist film for introduction of the $n^+$-type emitter region are removed by ashing and the like.

Figure 28:
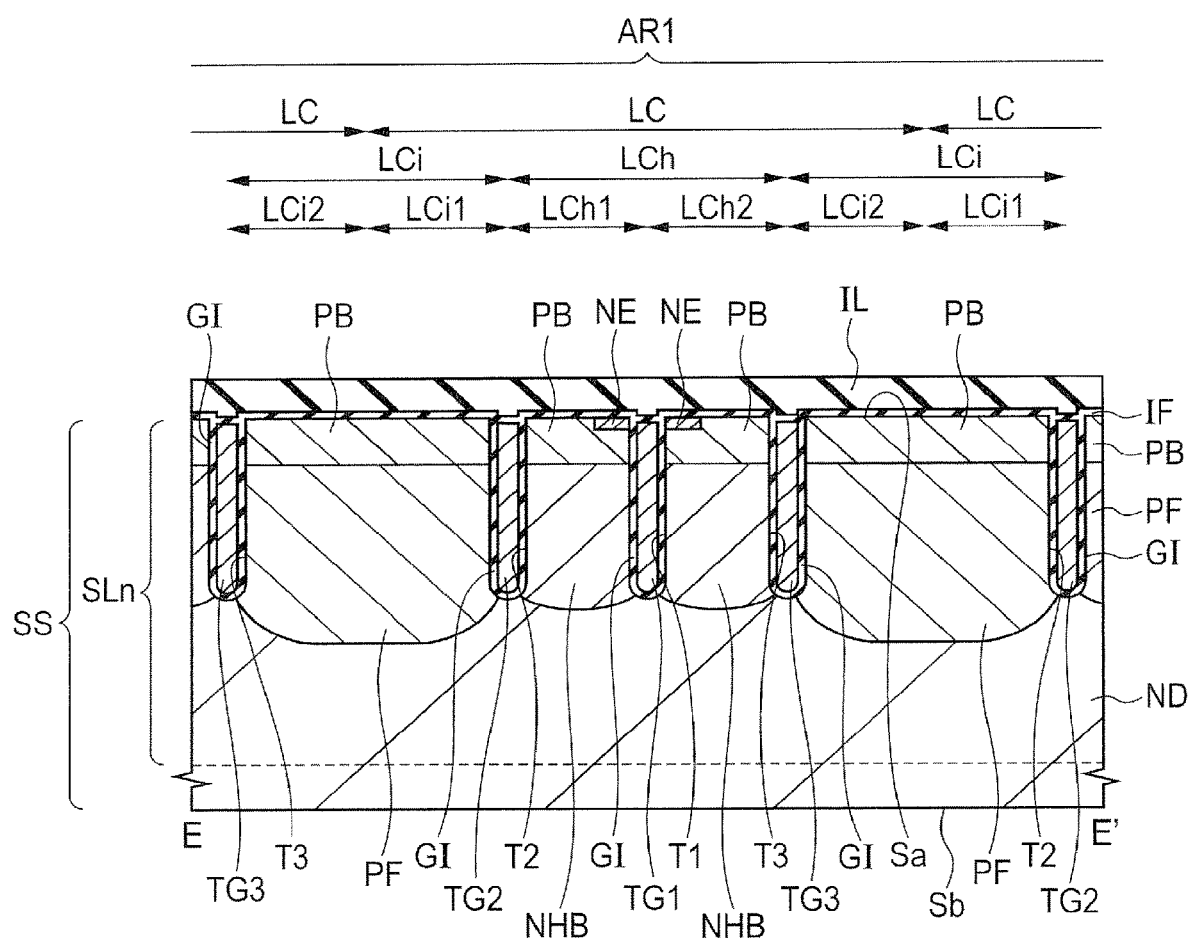
FIG. 28 is a cross-sectional view (taken along the line E-E') of another manufacturing step for the semiconductor device, following the step shown in FIGS. 26 and 27.
Figure 29:
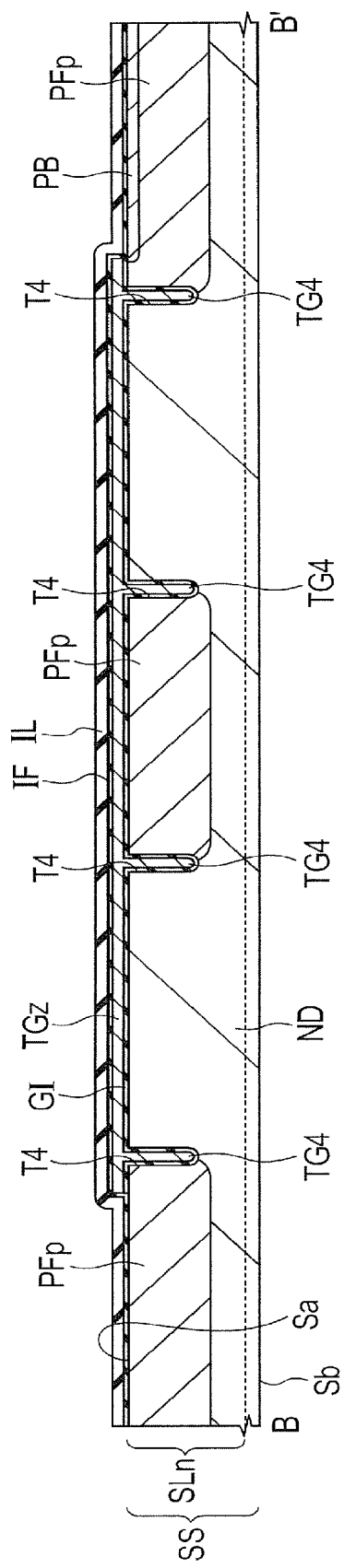
FIG. 29 is another cross-sectional view (taken along the line B-B') of the manufacturing step for the semiconductor device, following the step shown in FIGS. 26 and 27.

Then, as shown in FIGS. 28 and 29, an interlayer insulating film IL is formed of, for example, phospho-silicate glass (PSG) film, over the upper surface Sa of the semiconductor substrate SS, for example, by the CVD method. The interlayer insulating film IL is formed to cover the p-type body region PB, the extraction electrode TGz, and the like via the insulating film IF. The thickness of the interlayer insulating film IL is, for example, about 0.6 μm. Suitable materials for the interlayer insulating film IL can include, in addition to a PSG film, a boro-phospho silicate glass (BPSG) film, a non-doped silicate glass (NSG) film, a spin-on-glass (SOG) film, and a composite film thereof.

Figure 30:
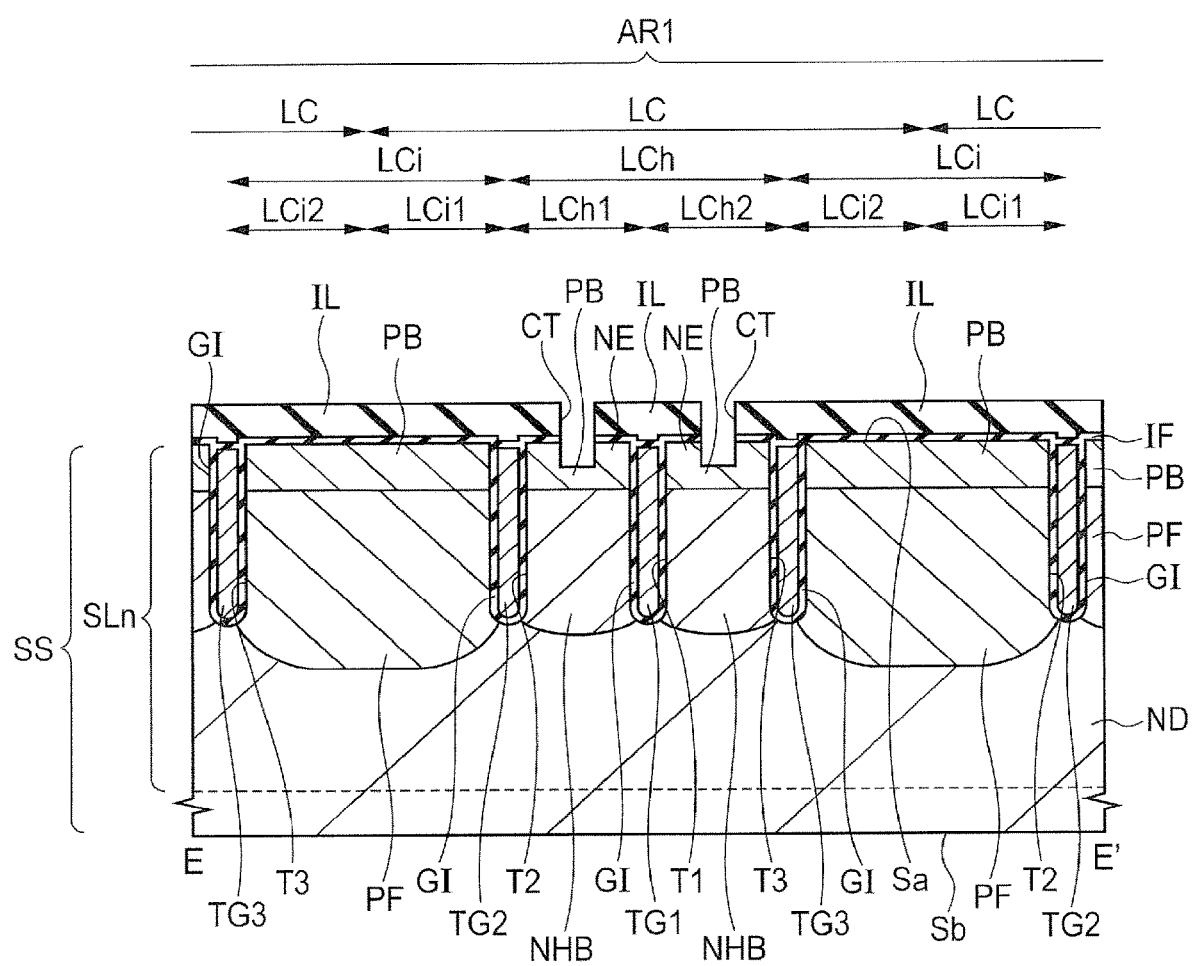
FIG. 30 is a cross-sectional view (taken along the line E-E') of another manufacturing step for the semiconductor device, following the step shown in FIGS. 28 and 29.
Figure 31:
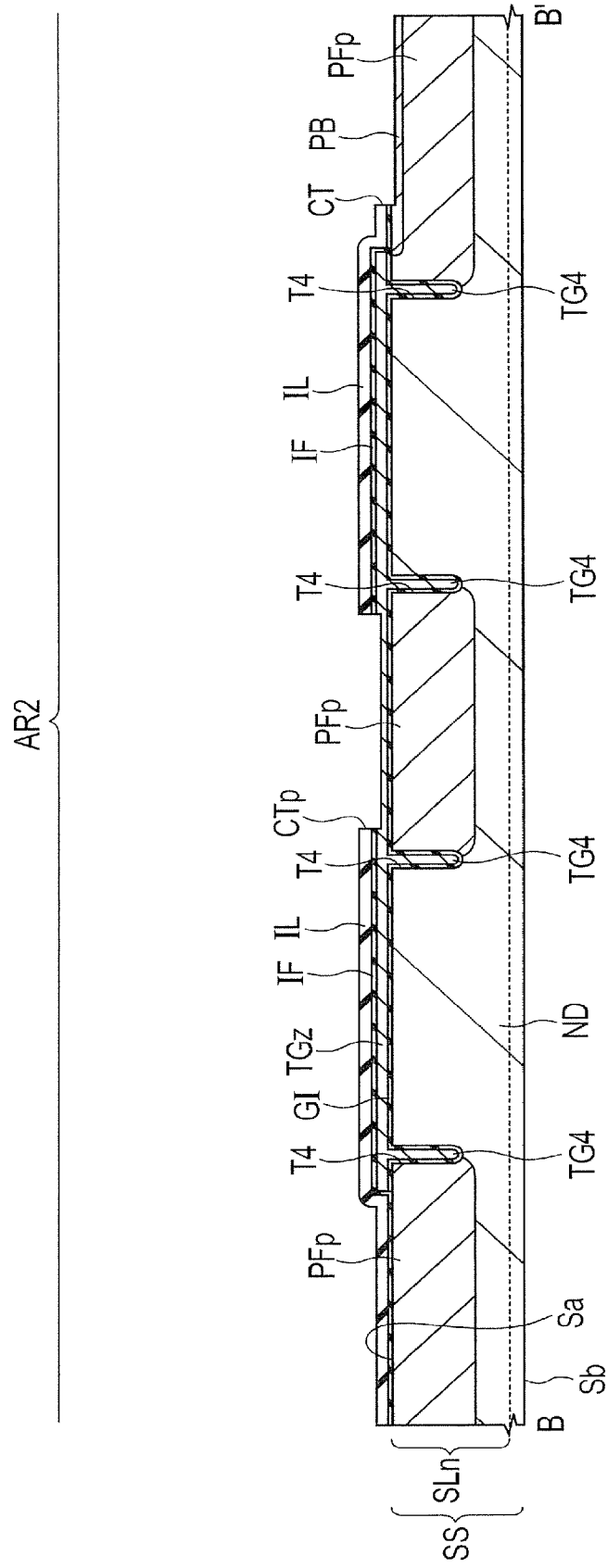
FIG. 31 is another cross-sectional view (taken along the line B-B') of the manufacturing step for the semiconductor device, following the step shown in FIGS. 28 and 29.

Next, as shown in FIGS. 30 and 31, a resist film (not shown) for formation of the contact trench is formed over the interlayer insulating film IL by the normal photolithography. Subsequently, the contact trenches CT and CTp are formed, for example, by the anisotropic dry etching. Specifically, in the cell formation region AR1, the contact trench CT is formed in contact with the $n^+$-type emitter region NE, while in the gate wiring lead-out region AR2, the contact trench CTp is formed in contact with the extraction electrode TGz and the contact trench CT is formed in contact with the p-type body region PB. Suitable gas for the anisotropic dry etching can be, for example, a mixed gas of Ar gas, $CHF_3$ gas, and $CF_4$ gas. Thereafter, unnecessary parts of the resist film for formation of the contact trenches are removed by ashing and the like.

In the first embodiment, the contact trenches CT and CTp are simultaneously formed, but alternatively, respective resist films for the contact trenches CT and CTp may be formed, whereby the contact trenches CT and CTp may be formed in different steps.

Figure 32:
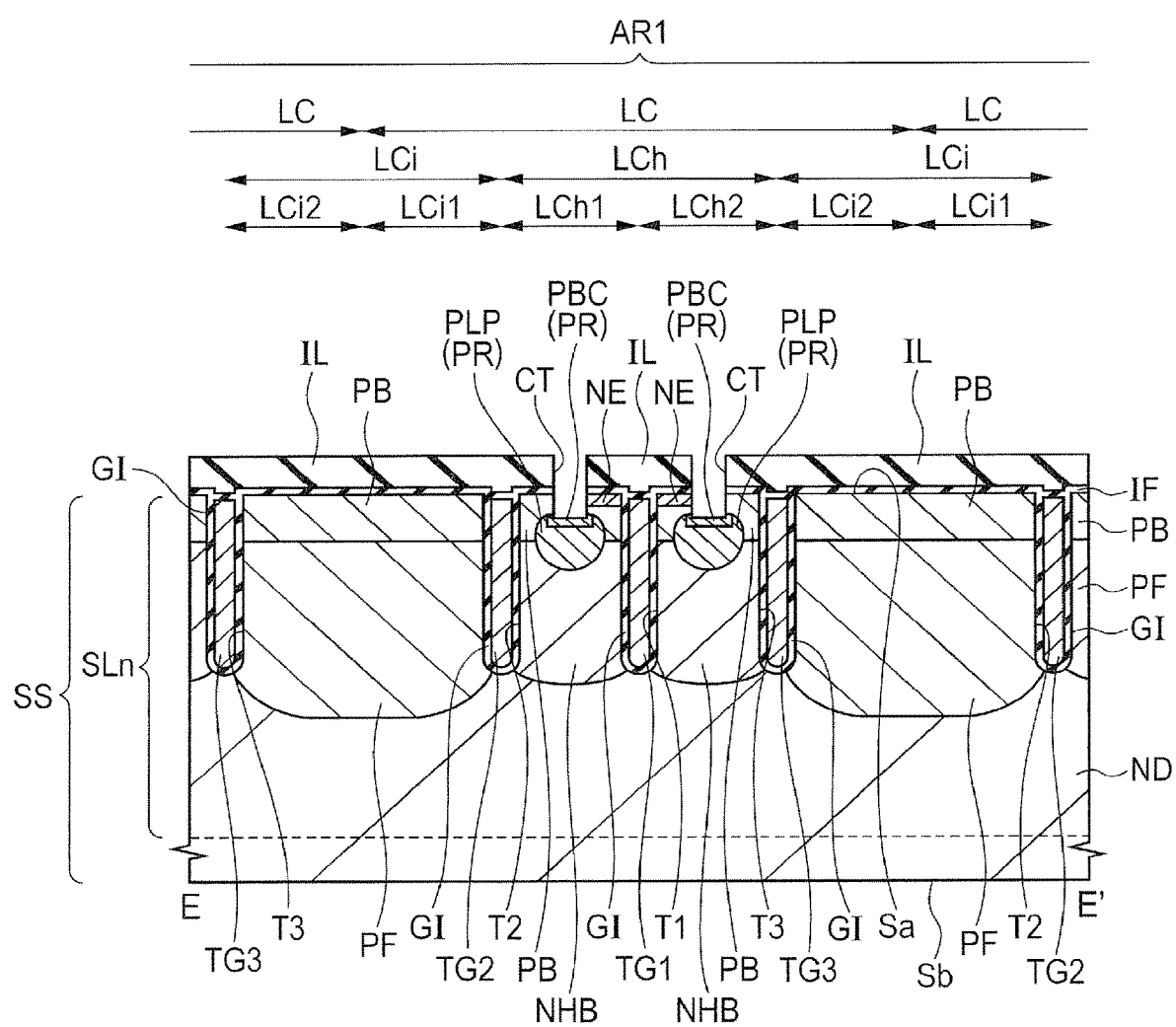
FIG. 32 is a cross-sectional view (taken along the line E-E') of another manufacturing step for the semiconductor device, following the step shown in FIGS. 30 and 31.
Figure 33:
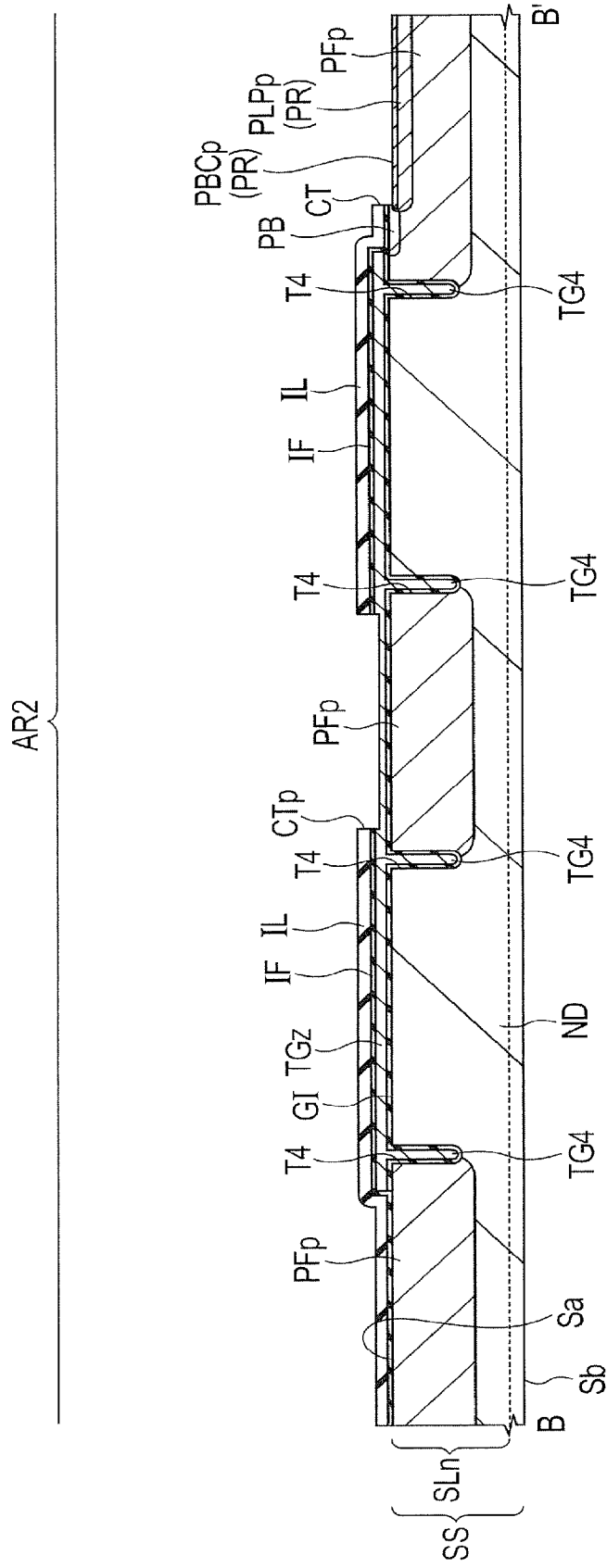
FIG. 33 is another cross-sectional view (taken along the line B-B') of the manufacturing step for the semiconductor device, following the step shown in FIGS. 30 and 31.

Next, as shown in FIGS. 32 and 33, p-type impurities are ion-implanted, for example, through the contact trenches CT and CTp, whereby the $p^+$-type body contact region PBC is formed in the cell formation region AR1, while the $p^+$-type body contact region PBCp is formed in the gate wiring lead-out region AR2. At this time, suitable conditions for the ion implantation can be, for example, ion species of boron difluoride ($BF_2$), a dose amount of approximately $5\times10^{15}$ $cm^{-2}$, and an implantation energy of about 80 KeV.

Likewise, p-type impurities are ion-implanted, for example, through the contact trenches CT and CTp, whereby the $p^+$-type latch-up prevention region PLP is formed in the cell formation region AR1, while the $p^+$-type latch-up prevention region PLPp is formed in the gate wiring lead-out region AR2. At this time, suitable conditions for the ion implantation can be, for example, ion species of boron (B), a dose amount of approximately $3\times10^{15}$ $cm^{-2}$, and an implantation energy of about 80 KeV.

The p-type impurity concentration in each of the $p^+$-type body contact regions PBC and PBCp is higher than that in each of the p+-type latch-up prevention regions PLP and PLPp. In the cell formation region AR1, the p+-type semiconductor region PR is formed of the p+-type body contact region PBC and the p+-type latch-up prevention region PLP. Likewise, in the gate wiring lead-out region AR2, the p+-type semiconductor region PR is formed of the p+-type body contact region PBCp and p+-type latch-up prevention region PLPp. The p-type impurity concentration in each of the p+-type semiconductor regions PR is higher than that in the p-type body region PB.

Figure 34:
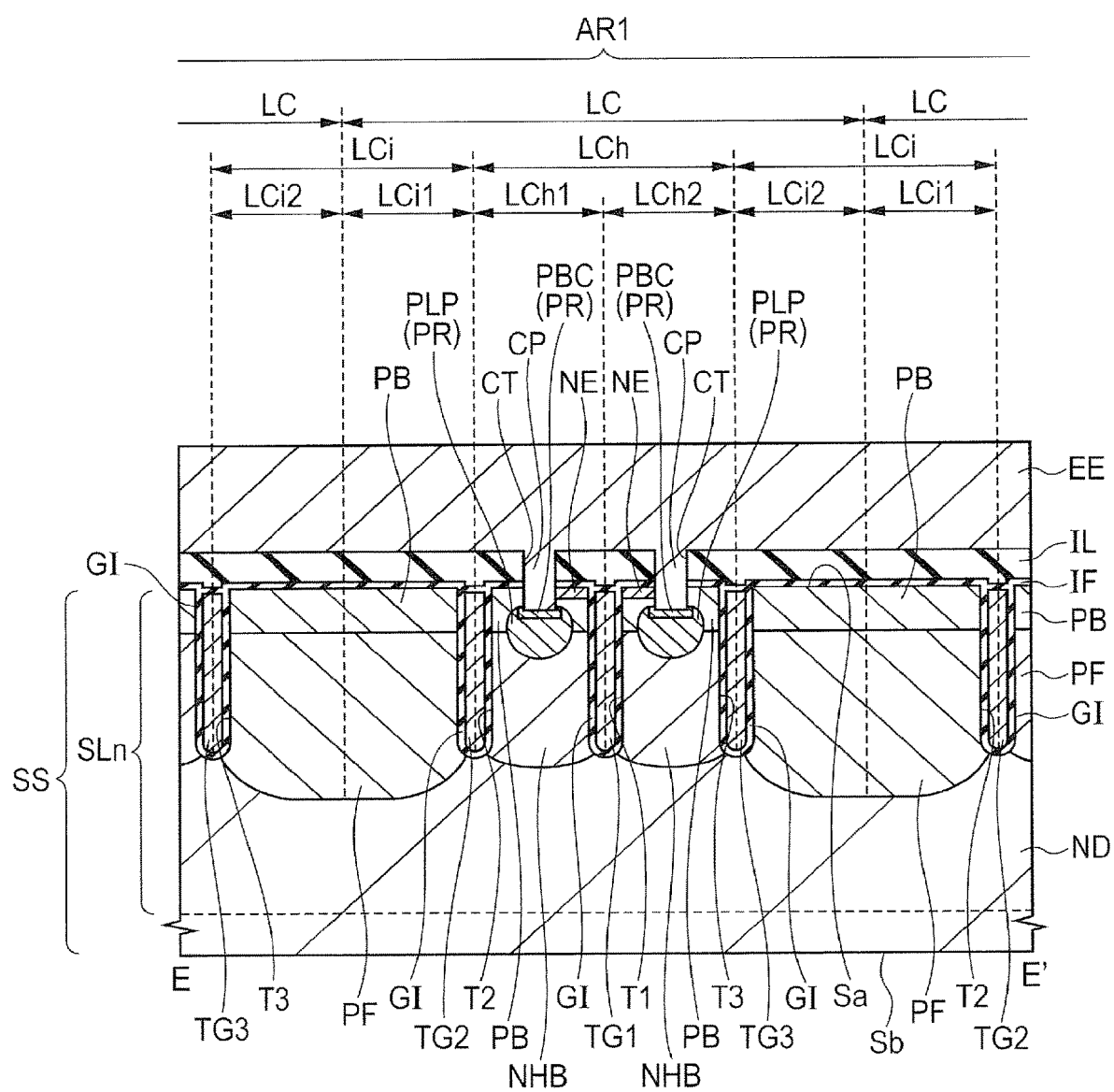
FIG. 34 is a cross-sectional view (taken along the line E-E') of another manufacturing step for the semiconductor device, following the step shown in FIGS. 32 and 33.
Figure 35:
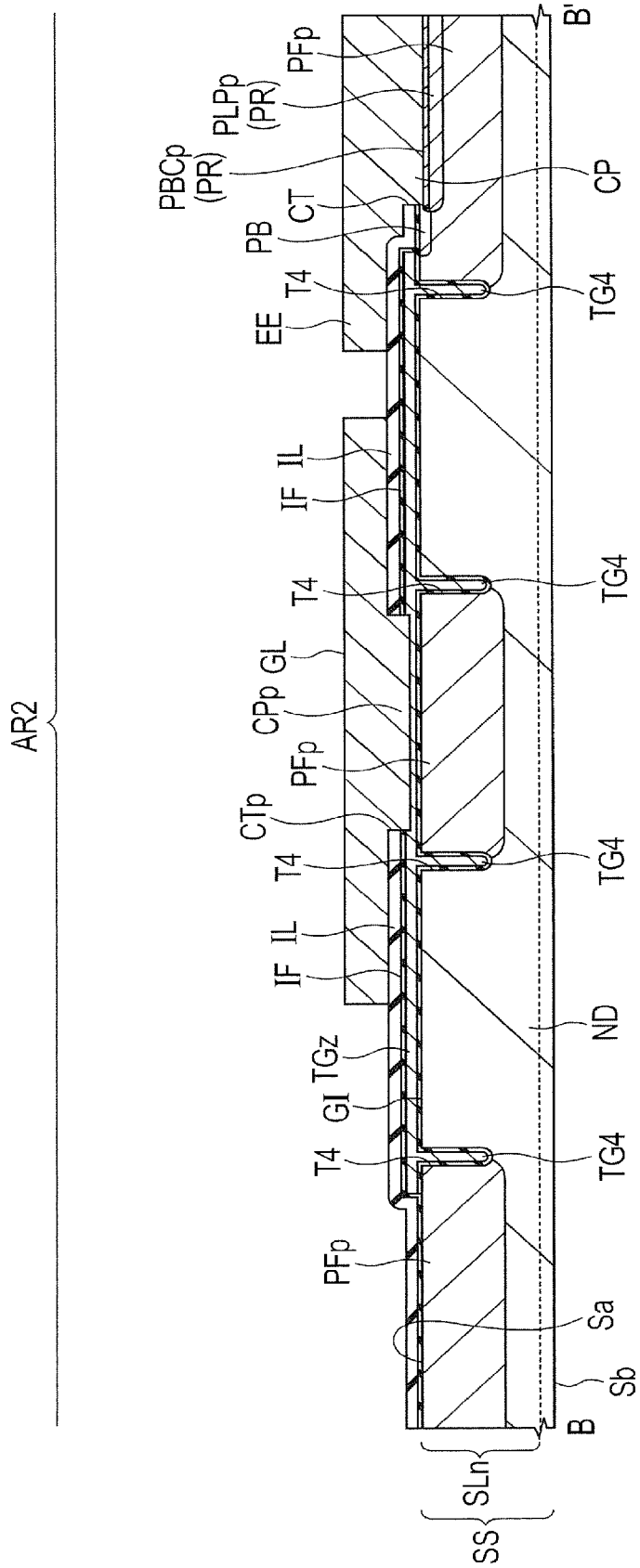
FIG. 35 is another cross-sectional view (taken along the line B-B') of the manufacturing step for the semiconductor device, following the step shown in FIGS. 32 and 33.

Then, as shown in FIGS. 34 and 35, the emitter electrode EE, the gate wiring GL, and the gate electrode GE (see FIG. 1) are formed. Specifically, for example, the following procedure is executed. First, a titanium tungsten (TiW) film is formed as a barrier metal film over the upper surface Sa of the semiconductor substrate SS, for example, by sputtering. The thickness of the titanium tungsten (TiW) film is, for example, about 0.2 μm. Most of titanium (Ti) in the titanium tungsten (TiW) film moves to the interface of silicon (Si) (e.g. exposed surfaces of the p+-type body contact regions PBC and PBCp, an exposed surface of the extraction electrode TGz, and the like) by a subsequent heat treatment to form silicide, which contributes to improving the contact properties. Note that these processes are very complicated and thus the illustration thereof will be omitted in the figures.

Then, silicide annealing is executed in a nitrogen atmosphere, for example, at about 600° C. for around 10 minutes, and an aluminum (Al) based metal film (for example, by adding several % of silicon (Si), the remainder being aluminum (Al)) is formed over the entire barrier metal film to fill the contact trenches CT and CTp, for example, by the sputtering. The thickness of the aluminum (Al) based metal film is, for example, about 5 μm.

Next, a resist film (not shown) for formation of the emitter electrode, gate wiring, and gate electrode is formed by the normal photolithography. Subsequently, the aluminum (Al) based metal film and barrier metal film are patterned, for example, by dry etching, to make the emitter electrode EE, gate wiring GL, and gate electrode GE (see FIG. 1). Suitable gas for the dry etching can be, for example, $Cl_2/BCl_3$ based gas. Thereafter, unnecessary parts of the resist film for formation of the emitter electrode, gate wiring, and gate electrode are removed by asking and the like.

Thus, in the hybrid sub-cell region LCh1, a plurality of connection electrodes CP embedded in the contact trenches CT and the emitter electrode EE formed over the interlayer insulating film IL are formed. The emitter electrode EE is electrically coupled to the n+-type emitter regions NE and the p+-type semiconductor regions PR formed in the respective hybrid sub-cell regions LCh1 and LCh2 via the connection electrodes CP formed in the respective hybrid sub-cell regions LCh1 and LCh2.

In the gate wiring lead-out region AR2, the connection electrodes CPp embedded in the respective contact trenches CTp, the gate wiring GL, and the gate electrode GE (see FIG. 1) are formed. The gate electrode GE (see FIG. 1) is electrically coupled to the trench gate electrode TG4 via the gate wiring GL and the extraction electrode TGz.

Figure 36:
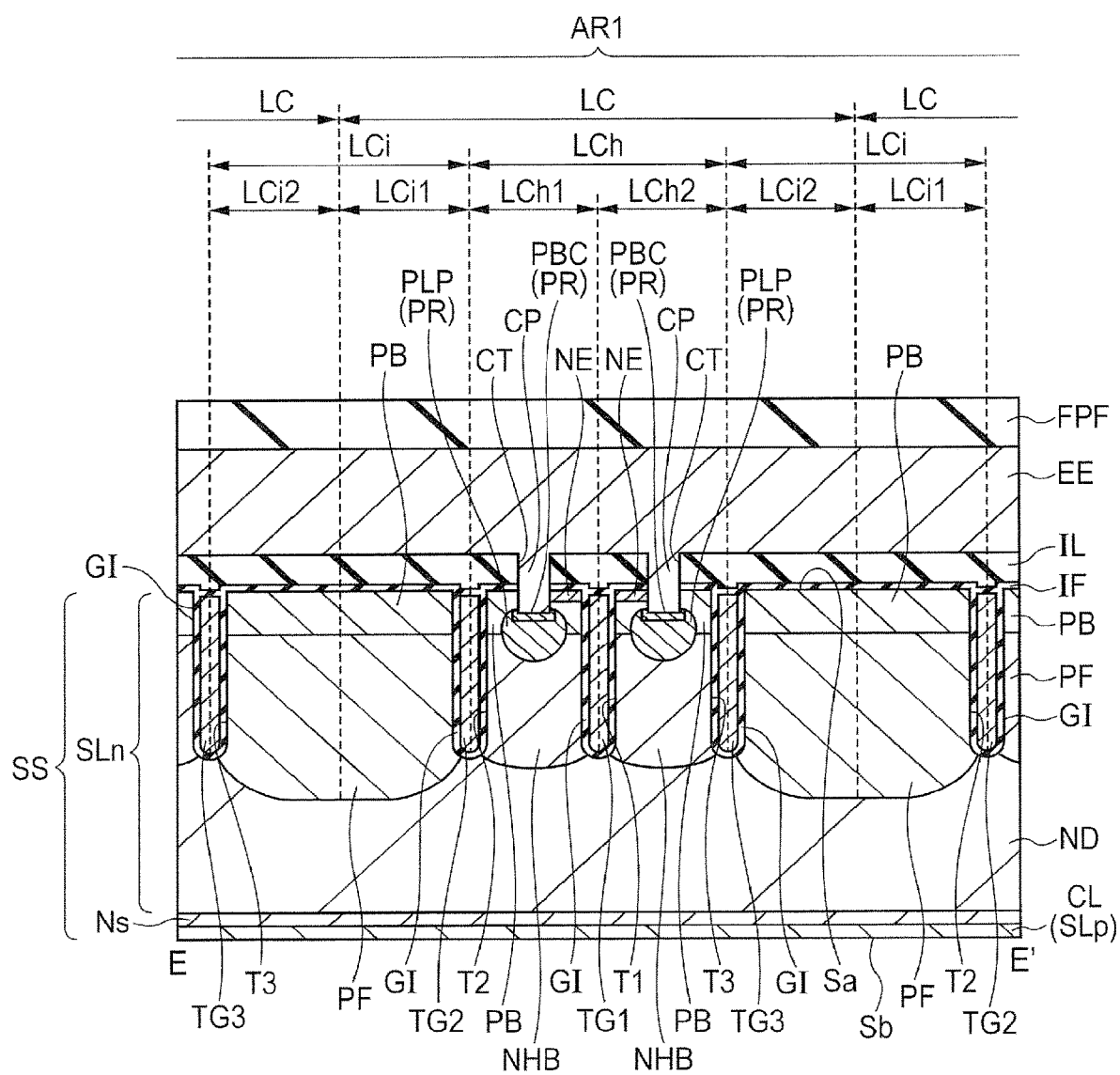
FIG. 36 is a cross-sectional view (taken along the line E-E') of another manufacturing step for the semiconductor device, following the step shown in FIGS. 34 and 35.
Figure 37:
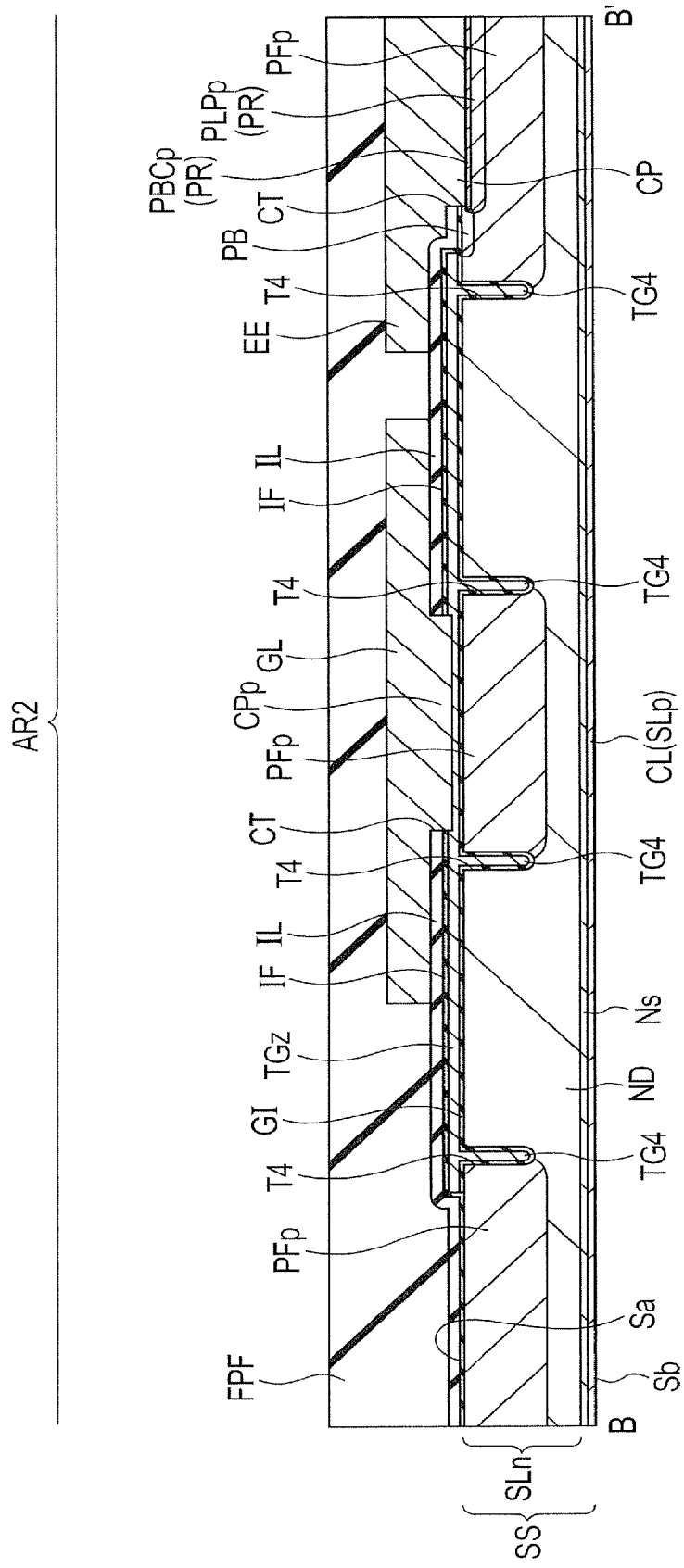
FIG. 37 is another cross-sectional view (taken along the line B-B') of the manufacturing step for the semiconductor device, following the step shown in FIGS. 34 and 35.

Then, as shown in FIGS. 36 and 37, an insulating film (passivation film) FPF is formed of an organic film or the like containing, for example, polyimide as a principal component, over the emitter electrode EE, the gate wiring GL, the gate electrode GE, and the like (see FIG. 1). The thickness of the insulating film FPF is, for example, about 2.5 μm.

Next, a resist film (not shown) for formation of openings is formed by the normal photolithography. Subsequently, the insulating film FPF is patterned, for example, by dry etching. Thus, an opening OP1 (see FIG. 1) is formed to reach the emitter electrode EE while passing through the insulating film FPF, thereby forming an emitter pad EP (see FIG. 1) made of part of the emitter electrode EE exposed from the opening OP1. At the same time, an opening OP2 (see FIG. 1) is formed to reach the gate electrode GE while passing through the insulating film FPF, thereby forming a gate pad GP (see FIG. 1) made of part of the gate electrode GE exposed from the opening OP2. Thereafter, unnecessary parts of the resist film for formation of the opening are removed by asking and the like.

Then, a back grinding process is applied to the lower surface Sb of the semiconductor substrate SS, thereby decreasing the thickness thereof, for example, of about 800 μm to about 30 μm to 200 μm as needed. For example, when the breakdown voltage is about 600 V, the final thickness of the semiconductor substrate is about 70 μm. In this way, in the thinned semiconductor substrate SS, a semiconductor layer SLp is formed within a portion of the semiconductor substrate SS positioned on the lower surface Sb side with respect to the semiconductor layer SLn. To remove a damaged part of the lower surface Sb, chemical etching and the like is performed as needed.

In the thinned semiconductor substrate SS, a semiconductor layer SLp is defined as the semiconductor layer having the p+-type collector region CL formed therein and located on the lower surface Sb side with respect to the semiconductor layer where the n-type field stop region Ns is to be formed.

Then, n-type impurities are introduced into the lower surface Sb of the semiconductor substrate SS, for example, by ion implantation, to thereby form the n-type field stop region Ns. Here, suitable conditions for the ion implantation can be, for example, ion species of phosphorus (P), a dose amount of approximately $7 \times 10^{12}$ cm$^{-2}$, and an implantation energy of about 350 KeV. Thereafter, to activate the impurities, laser annealing and the like is performed on the lower surface Sb of the semiconductor substrate SS as appropriate.

Then, p-type impurities are introduced into the lower surface Sb of the semiconductor substrate SS, for example, by ion implantation, to thereby form the p+-type collector region CL. Here, suitable conditions for the ion implantation can be, for example, ion species of boron (B), a dose amount of approximately $1 \times 10^{13}$ cm$^{-2}$, and an implantation energy of about 40 KeV. Thereafter, to activate the impurities, laser annealing and the like is performed on the lower surface Sb of the semiconductor substrate SS as appropriate.

That is, in the step of forming the p+-type collector region CL, the p-type semiconductor layer SLp is formed within the part of the semiconductor substrate SS positioned on the lower surface Sb side with respect to the semiconductor layer SLn, whereby the p+-type collector region CL is formed by the p-type semiconductor layer SLp.

Then, as shown in FIGS. 3 to 7, the collector electrode CE is formed over the lower surface Sb of the semiconductor substrate SS, for example, by the sputtering so as to be electrically coupled to the semiconductor layer SLp, that is, the p+-type collector region CL. Thereafter, the semiconductor substrate SS is divided into chip regions by dicing and the like, whereby the semiconductor device in the first embodiment is completed by being sealed in a package as needed.

Modified Example of First Embodiment

Figure 38:
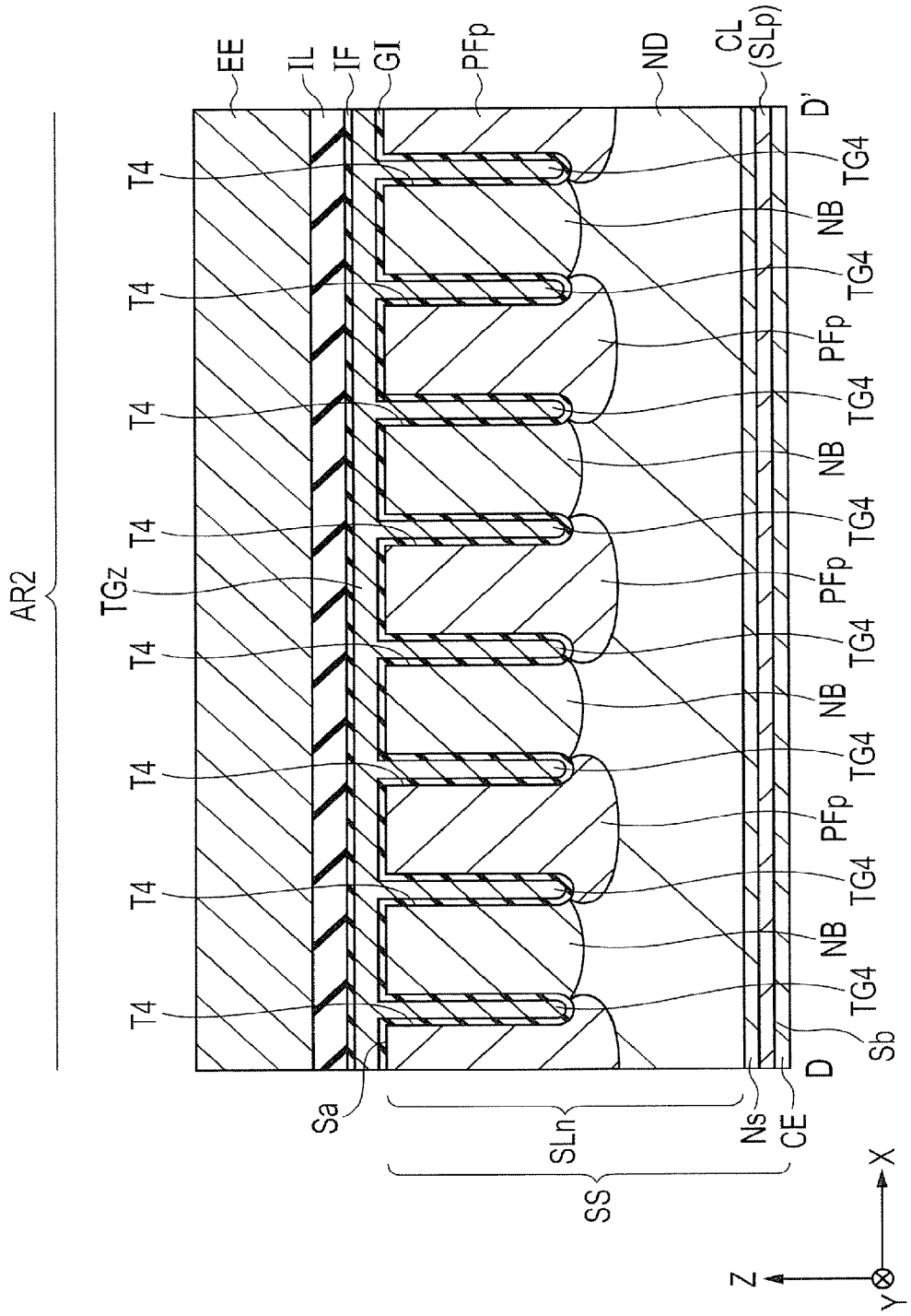
FIG. 38 is across-sectional view (cross-sectional view taken along the line D-D' of FIG. 2) of a gate wiring lead-out region of a semiconductor device in a modified example of the first embodiment.

The structure of a semiconductor device including a trench-gate IGBT in a modified example of the first embodiment will be described below with reference to FIG. 38. FIG. 38 is a cross-sectional view of a gate wiring lead-out region of the semiconductor device in the modified example of the first embodiment, corresponding to a cross-sectional view taken along the line D-D' of FIG. 2. The structure of the semiconductor device in the modified example has substantially the same structure as that in the above-mentioned first embodiment, and thus the only differences therebetween will be described below.

In the modified example, in the gate wiring lead-out region AR2, like the first embodiment described above, each trench T4 filled with the trench gate electrode TG4 has a shape enclosed by a rectangular outer outline and a rectangular inner outline in plan view. An n-type semiconductor region NB leading to the n⁻-type drift region ND is formed in the region located outside the trench T4 and inside the inner outline of each trench T4 in plan view. In other words, the trenches T4 are formed within the p-type region PFp, while in the region located outside each trench T4 and inside the inner outline of each trench T4 in plan view, the n-type semiconductor region NB is formed from the upper surface Sa of the semiconductor substrate SS in the depth direction (−Z direction) to reach substantially the bottom surface of the trench T4. The part forming the n-type semiconductor region NB serves as a part that forms the gate-collector capacitance (reverse transfer capacitance).

The impurity concentration in the n-type semiconductor region NB is higher than that in the n⁻-type drift region ND, and the n-type semiconductor region NB is formed, whereby the gate-collector capacitance (reverse transfer capacitance) can be further increased and can also be easily adjusted. The n-type semiconductor region NB can be formed at the same time as the n-type hole barrier region NHB, for example, formed in the cell formation region AR1.

Second Embodiment

Figure 39:
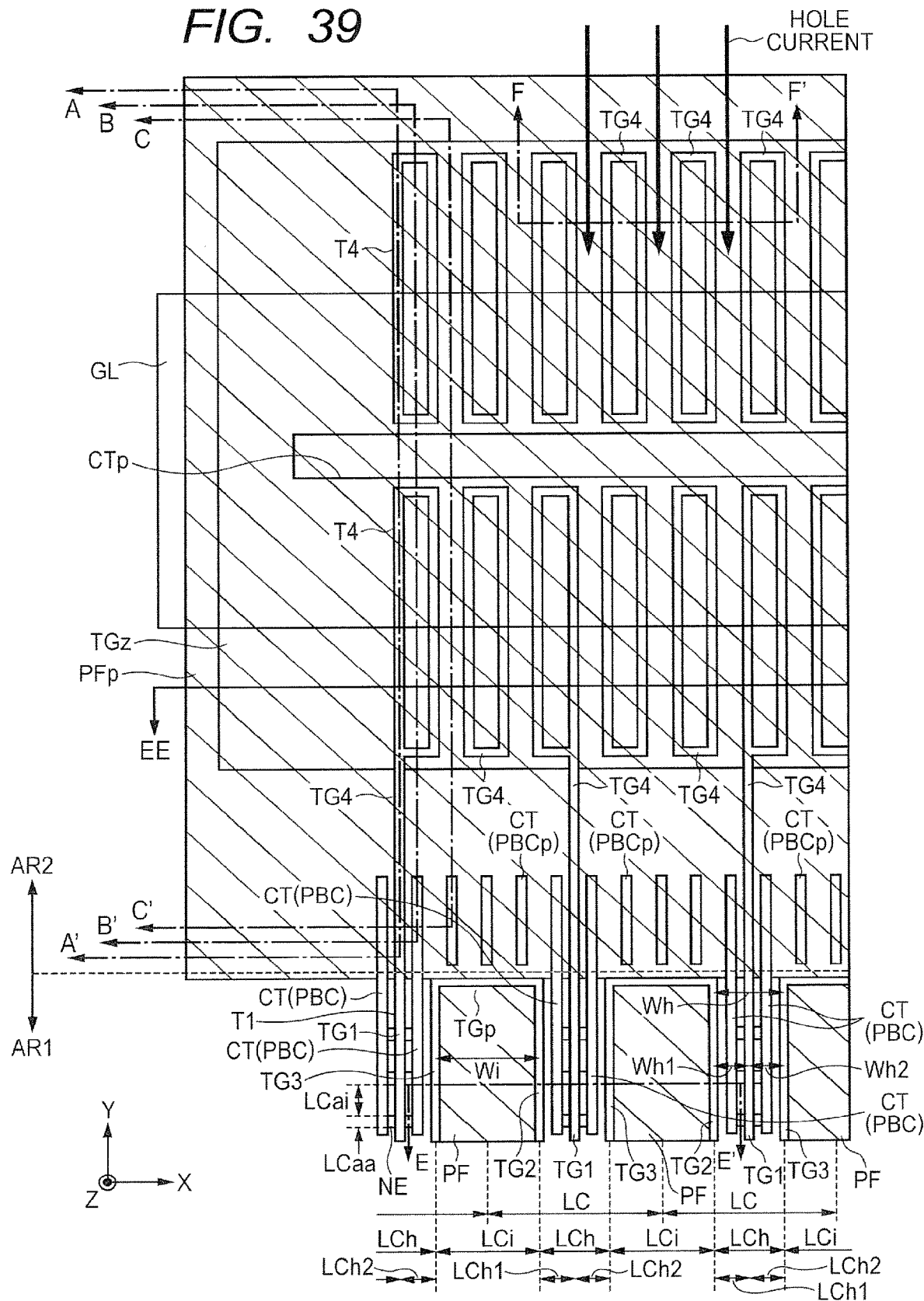
FIG. 39 is a partially enlarged plan view of a cell formation region and a gate wiring lead-out region in a semiconductor device according to a second embodiment, corresponding to a CGR region enclosed by an alternate long and short dash line shown in FIG. 1.
Figure 40:
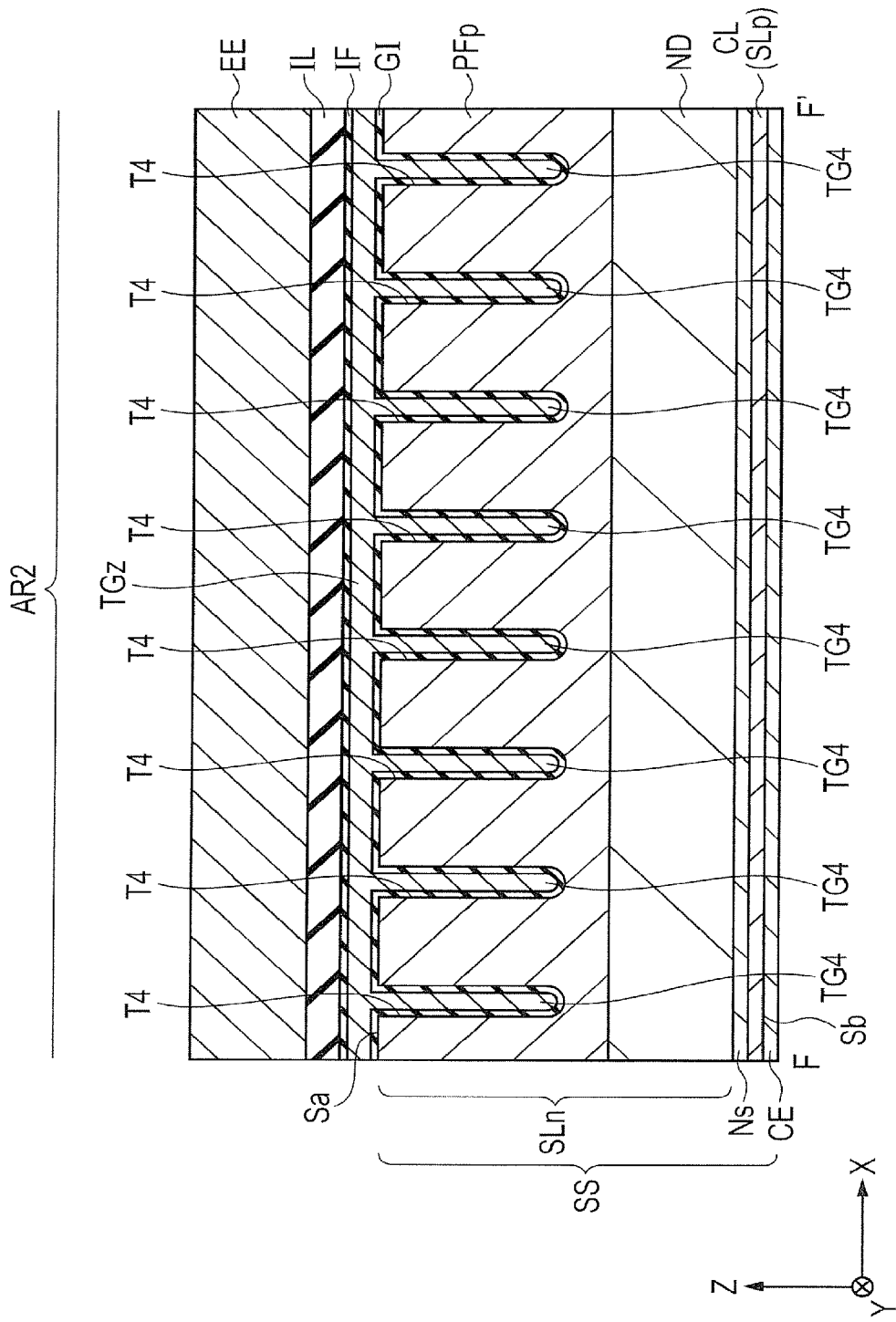
FIG. 40 is a cross-sectional view taken along the line F-F' of FIG. 39.

The structure of a semiconductor device including a trench-gate IGBT according to a second embodiment will be described below with reference to FIGS. 39 and 40. FIG. 39 is a partially enlarged plan view of a cell formation region and a gate wiring lead-out region in the semiconductor device according to the second embodiment, corresponding to a CGR region enclosed by an alternate long and short dash line shown in FIG. 1. FIG. 40 is a cross-sectional view taken along the line F-F' of FIG. 39. A difference between the second embodiment and the first embodiment described above is the structure of the gate wiring lead-out region AR2. The structures of other components in the second embodiment are the same or substantially same as those of the first embodiment described above, and their description will be omitted.

In the above-mentioned first embodiment, in the gate wiring lead-out region AR2, each trench T4 with the trench gate electrode TG4 embedded therein has a shape enclosed by a rectangular outer outline and a rectangular inner outline in plan view, and the n-type semiconductor region, for example, the n⁻-type drift region ND is formed in the region off the trench T4 and inside the inner outline of the trench T4 in plan view (see FIGS. 5 and 7 and the like).

In contrast, in the second embodiment, as shown in FIGS. 39 and 40, in the gate wiring lead-out region AR2, the trench T4 with the trench gate electrode TG4 embedded therein has a shape enclosed by a rectangular outer outline and a rectangular inner outline in plan view, but the p-type region PFp is also formed in the region located outside the trench T4 and inside the inner outline of the trench T4 in plan view.

In other words, all trenches T4 are formed in the p-type region PFp, and the gate insulating film GI formed at the inner walls of all the trenches T4 is in contact with the p-type region PFp.

Since the p-type region PFp having the emitter potential is formed across the entire gate wiring lead-out region AR2, the gate-collector capacitance (reverse transfer capacitance) is not increased. However, the formation of the trenches T4 spaced apart from each other in the X direction can ensure the route not interrupting the flow of the hole current, thereby increasing an input capacitance (mainly the gate-emitter capacitance) without decreasing the breakdown resistance.

For example, the semiconductor device including the trench-gate IGBT that is required to reduce noise (such as measures against electromagnetic interference (EMI)) often needs to reduce its loss even though its operating speed becomes slow. In such a case, the structure of the semiconductor device in the second embodiment is advantageously applied.

Although the invention made by the inventors has been specifically described based on the embodiments, the invention is not limited to the embodiments, and various modifications and changes can be made to those embodiments without departing from the scope of the invention.

What is claimed is:

1. A method for manufacturing a semiconductor device, the semiconductor device including a first region provided at a center of a semiconductor substrate and a second region provided outside the first region in a planar view, the method comprising the steps of:

(a) providing the semiconductor substrate of a first conductive type having a first main surface and a second main surface opposite to the first main surface;

(b) forming a plurality of first trenches extending in a first direction in the first region such that the first trenches are spaced apart from each other in a second direction perpendicular to the first direction at the first main surface, each of the first trenches having a first depth from the first main surface, and forming a plurality of second trenches in the second region such that the second trenches are spaced apart from each other in the second direction, each of the second trenches having a second depth from the first main surface and having a shape enclosed by a rectangular outer outline and a rectangular inner outline in plan view;

(c) forming a first semiconductor region by ion-implanting impurities of a second conductive type different from the first conductive type, into a part of the semiconductor substrate in the second region located outside the second trenches and outside the outer outlines of the respective second trenches in plan view, the first semiconductor region having a third depth from the first main surface deeper than the second depth;

(d) forming a first conductive film over the first main surface via a first insulating film to fill insides of the respective first trenches and the respective second trenches;

(e) by processing the first conductive film using a patterned resist film as a mask, forming a plurality of first trench gate electrodes made of the first conductive film in the respective first trenches via the first insulating film, forming a plurality of second trench gate electrodes made of the first conductive film in the respective second trenches via the first insulating film, and forming an extraction electrode made of the first conductive film over the first main surface integrally with the second trench gate electrodes via the first insulating film; and (f) after forming an interlayer insulating film over the first main surface, forming a gate electrode over the interlayer insulating film, the gate electrode being electrically coupled to the extraction electrode, wherein each of the first trenches leads to any one of the second trenches, and the second trench gate electrodes are electrically coupled to the first trench gate electrodes.

2. The method for manufacturing a semiconductor device according to claim 1, wherein the first semiconductor region is not formed in a region inside the inner outline of each of the second trenches in plan view.

3. The method for manufacturing a semiconductor device according to claim 1, the method further comprising the step of:

(g) between the steps (b) and (c), or between the steps (c) and (d), forming a second semiconductor region in contact with the second insulating film by ion-implanting impurities of the first conductive type into parts of the semiconductor substrate in the second region located outside the second trenches and inside the respective inner outlines of the second trenches in plan view, the second insulating film having a fourth depth from the first main surface.

4. The method for manufacturing a semiconductor device according to claim 1, wherein the first semiconductor region is in contact with the second insulating film.

5. The method for manufacturing a semiconductor device according to claim 1, wherein the first conductive film is made of polycrystalline silicon.

6. A method for manufacturing a semiconductor device, the semiconductor device including a first region provided at a center of a semiconductor substrate and a second region provided outside the first region in a planar view, the method comprising the steps of:

(a) providing the semiconductor substrate of a first conductive type having a first main surface and a second main surface opposite to the first main surface;

(b) forming a plurality of first trenches extending in a first direction in the first region such that the first trenches are spaced apart from each other in a second direction perpendicular to the first direction at the first main surface, each of the first trenches having a first depth from the first main surface, and forming a plurality of second trenches in the second region such that the second trenches are spaced apart from each other in the second direction, each of the second trenches having a second depth from the first main surface and having a shape enclosed by a rectangular outer outline and a rectangular inner outline in plan view;

(c) forming a first semiconductor region by ion-implanting impurities of a second conductive type different from the first conductive type, into a part of the semiconductor substrate in the second region located outside the second trenches, the first semiconductor region having a third depth from the first main surface deeper than the second depth;

(d) forming a first conductive film over the first main surface via a first insulating film to fill insides of the respective first trenches and the respective second trenches;

(e) forming a plurality of first trench gate electrodes made of the first conductive film in the respective first trenches via the first insulating film, forming a plurality of second trench gate electrodes made of the first conductive film in the respective second trenches via the first insulating film, and forming an extraction electrode made of the first conductive film over the first main surface integrally with the second trench gate electrodes via the first insulating film, by processing the first conductive film using a patterned resist film as a mask; and (f) after forming an interlayer insulating film over the first main surface, forming a gate electrode over the interlayer insulating film, the gate electrode being electrically coupled to the extraction electrode, wherein each of the first trenches leads to any one of the second trenches, and the second trench gate electrodes are electrically coupled to the first trench gate electrodes.

7. The method for manufacturing a semiconductor device according to claim 6, wherein the first conductive film is made of polycrystalline silicon.

* * * * *